United States Patent
Uzoh et al.

(10) Patent No.: US 9,000,600 B2
(45) Date of Patent: Apr. 7, 2015

(54) REDUCED STRESS TSV AND INTERPOSER STRUCTURES

(71) Applicant: Invensas Corporation, San Jose, CA (US)

(72) Inventors: Cyprian Emeka Uzoh, San Jose, CA (US); Charles G. Woychik, San Jose, CA (US); Terrence Caskey, San Jose, CA (US); Kishor V. Desai, Fremont, CA (US); Huailiang Wei, Allen, TX (US); Craig Mitchell, San Jose, CA (US); Belgacem Haba, Saratoga, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/204,860

(22) Filed: Mar. 11, 2014

(65) Prior Publication Data
US 2014/0217607 A1    Aug. 7, 2014

Related U.S. Application Data

(63) Continuation of application No. 13/492,064, filed on Jun. 8, 2012, now Pat. No. 8,772,946.

(51) Int. Cl.
*H01L 23/48*    (2006.01)
*H01L 23/52*    (2006.01)
(Continued)

(52) U.S. Cl.
CPC ........ *H01L 23/481* (2013.01); *H01L 21/76898* (2013.01); *H01L 24/10* (2013.01); *H01L 23/147* (2013.01); *H01L 23/49811* (2013.01); *H01L 23/49827* (2013.01)

(58) Field of Classification Search
USPC .......................................... 257/774, 737, 778
See application file for complete search history.

(56) References Cited

U.S. PATENT DOCUMENTS

| 5,135,606 A | 8/1992 | Kato et al. |
|---|---|---|
| 8,039,960 B2 | 10/2011 | Lin |

(Continued)

FOREIGN PATENT DOCUMENTS

| JP | 2008218689 A | 9/2008 |
|---|---|---|

OTHER PUBLICATIONS

Bart Vandevelde et al., "Thermo-mechanics of 3D-wafer level and 3D stacked IC packaging technologies," Thermal Mechanical and Multi-Physics Simulation and Experiments in Microelectronics and Micro-Systems, 2008, Erosime 2008, International Conference on IEEE, Piscataway, New Jersey, USA, Apr. 20, 2008, pp. 1-7, XP031255111.

(Continued)

*Primary Examiner* — Karen Kusumakar
(74) *Attorney, Agent, or Firm* — Haynes and Boone, LLP

(57) ABSTRACT

A component can include a substrate and a conductive via extending within an opening in the substrate. The substrate can have first and second opposing surfaces. The opening can extend from the first surface towards the second surface and can have an inner wall extending away from the first surface. A dielectric material can be exposed at the inner wall. The conductive via can define a relief channel within the opening adjacent the first surface. The relief channel can have an edge within a first distance from the inner wall in a direction of a plane parallel to and within five microns below the first surface, the first distance being the lesser of one micron and five percent of a maximum width of the opening in the plane. The edge can extend along the inner wall to span at least five percent of a circumference of the inner wall.

15 Claims, 13 Drawing Sheets

(51) Int. Cl.
*H01L 29/40* (2006.01)
*H01L 21/768* (2006.01)
*H01L 23/00* (2006.01)
*H01L 23/14* (2006.01)
*H01L 23/498* (2006.01)

(56) References Cited

U.S. PATENT DOCUMENTS

| | | |
|---|---|---|
| 8,202,801 B1 | 6/2012 | Lin |
| 8,378,480 B2 | 2/2013 | Chen et al. |
| 8,519,515 B2 | 8/2013 | Kuo et al. |
| 2005/0121768 A1 | 6/2005 | Edelstein et al. |
| 2006/0001174 A1 | 1/2006 | Matsui |
| 2011/0254165 A1 | 10/2011 | Muranaka |
| 2011/0260329 A1 | 10/2011 | Seo |
| 2012/0049358 A1 | 3/2012 | Cheng |
| 2012/0126412 A1 | 5/2012 | Wang et al. |
| 2012/0133010 A1 | 5/2012 | Komukai |
| 2013/0328186 A1 | 12/2013 | Uzoh et al. |

OTHER PUBLICATIONS

Partial International Search Report for Application No. PCT/US2013/044519 dated Feb. 10, 2014, 8 pages.

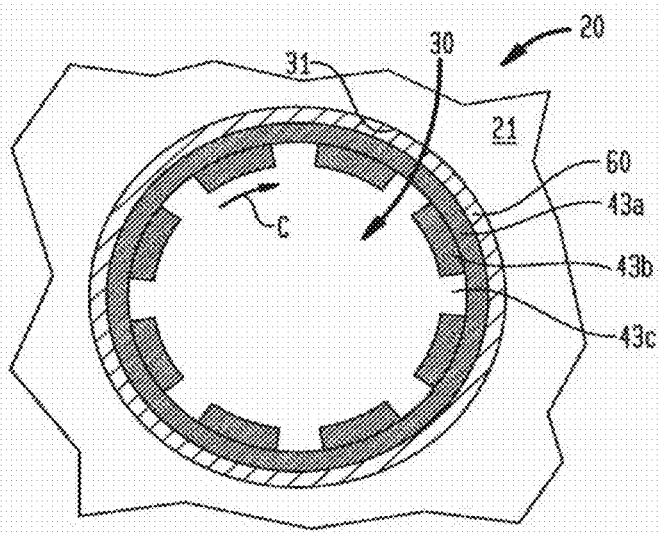
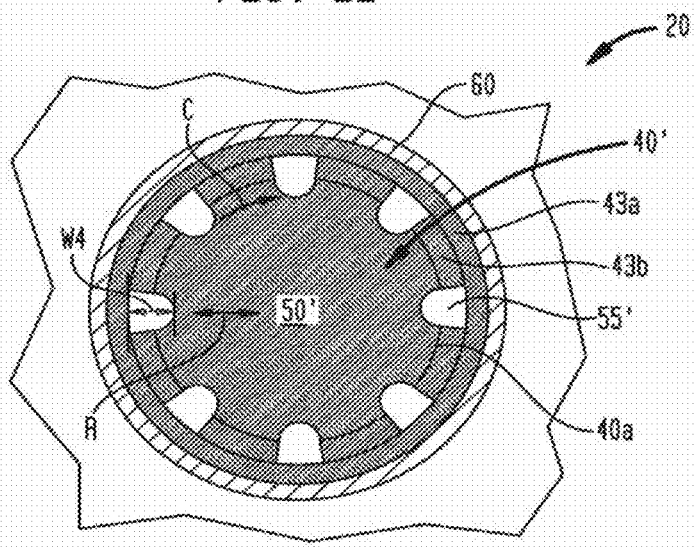

REDUCED STRESS TSV AND INTERPOSER STRUCTURES

CROSS-REFERENCE TO RELATED APPLICATIONS

This application is a continuation of U.S. patent application Ser. No. 13/492,064, filed Jun. 8, 2012, titled "REDUCED STRESS TSV AND INTERPOSER STRUCTURES", incorporated herein in its entirety by reference.

BACKGROUND OF THE INVENTION

The present invention relates to packaging of microelectronic devices and interposer structures, especially conductive via structures and methods of forming such via structures in semiconductor and interposer packages.

Microelectronic elements generally comprise a thin slab of a semiconductor material, such as silicon or gallium arsenide, commonly called a die or a semiconductor chip. Semiconductor chips are commonly provided as individual, prepackaged units. In some unit designs, the semiconductor chip is mounted to a substrate or chip carrier, which is in turn mounted on a circuit panel, such as a printed circuit board.

The active circuitry is fabricated in a first face of the semiconductor chip (e.g., a second surface). To facilitate electrical connection to the active circuitry, the chip is provided with bond pads on the same face. The bond pads are typically placed in a regular array either around the edges of the die or, for many memory devices, in the die center. The bond pads are generally made of a conductive metal, such as copper, or aluminum, around 0.5 µm thick. The bond pads could include a single layer or multiple layers of metal. The size of the bond pads will vary with the device type but will typically measure tens to hundreds of microns on a side.

Through-silicon vias (TSVs) are used to connect the bond pads with a second face of the semiconductor chip opposite the first face (e.g., a first surface). A conventional via includes a hole penetrating through the semiconductor chip and a conductive material extending through the hole from the first face to the second face. The bond pads may be electrically connected to vias to allow communication between the bond pads and conductive elements on the second face of the semiconductor chip.

Conventional TSV holes may reduce the portion of the first face that can be used to contain the active circuitry. Such a reduction in the available space on the first face that can be used for active circuitry may increase the amount of silicon required to produce each semiconductor chip, thereby potentially increasing the cost of each chip.

Conventional vias may have reliability challenges because of a non-optimal stress distribution radiating from the vias and a mismatch of the coefficient of thermal expansion (CTE) between a semiconductor chip, for example, and the structure to which the chip is bonded. For example, when conductive vias within a semiconductor chip are insulated by a relatively thin and stiff dielectric material, significant stresses may be present within the vias due to CTE mismatch between the conductive material of the via and the material of the substrate. In addition, when the semiconductor chip is bonded to conductive elements of a polymeric substrate, the electrical connections between the chip and the higher CTE structure of the substrate will be under stress due to CTE mismatch.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/Os." These I/Os must be interconnected with the I/Os of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Despite the advances that have been made in semiconductor via and interposer via formation and interconnection, there is still a need for improvements in order to minimize the size of semiconductor chips and interposer structures, while enhancing electrical interconnection reliability. These attributes of the present invention may be achieved by the construction of the components and the methods of fabricating components as described hereinafter.

BRIEF SUMMARY OF THE INVENTION

In accordance with an aspect of the invention, a component can include a substrate and a conductive via extending within an opening in the substrate. The substrate can have first and second opposing surfaces. The opening can extend from the first surface towards the second surface and can have an inner wall extending away from the first surface. A dielectric material can be exposed at the inner wall. The conductive via can define a relief channel within the opening adjacent the first surface. The relief channel can have an edge within a first distance from the inner wall in a direction of a plane parallel to and within five microns below the first surface, the first distance being the lesser of one micron and five percent of a maximum width of the opening in the plane. The edge can extend along the inner wall to span at least five percent of a circumference of the inner wall.

In a particular embodiment, the substrate can have an effective CTE in a plane of the substrate of no more than 20 ppm/° C. In one example, the substrate can consist essentially of one of: a semiconductor material, ceramic, glass, or a composite material. In an exemplary embodiment, the substrate can include a composite material having an effective CTE in a plane of the substrate that is tuned to match a CTE of the conductive via. In a particular example, the substrate can have an active device region adjacent the first surface, and the plane can be located below the active device region. In one embodiment, the plane can be located 1 micron below the active device region.

In one embodiment, the substrate can have an active device region adjacent the first surface, and at least some active semiconductor devices within the active device region can be within a distance in the plane from the opening of three times the maximum width of the opening. In one example, the substrate can have an active device region adjacent the first surface, and at least some active semiconductor devices within the active device region can be within a distance in the plane from the opening of two times the maximum width of the opening. In an exemplary embodiment, the substrate can have an active device region adjacent the first surface, and at least some active semiconductor devices within the active device region can be within a distance in the plane from the opening of one times the maximum width of the opening.

In a particular example, the substrate can consist essentially of the dielectric material. In one embodiment, the substrate can consists essentially of glass or ceramic. In a particular embodiment, the substrate can consist essentially of a semiconductor material, and the dielectric material can be a dielectric layer overlying the semiconductor material within the opening. In one example, a portion of the inner wall can be exposed within the relief channel. In an exemplary embodiment, a width of the relief channel in a radial direction from the inner wall in the relief plane can be less than 5 microns. In a particular example, a width of the relief channel in a radial direction from the inner wall in the relief plane can be less than 1 micron. In one embodiment, a width of the relief channel in a radial direction from the inner wall in the relief plane can be less than 0.2 microns.

In a particular embodiment, a depth of the relief channel below the first surface of the substrate can be at most two times the maximum width of the opening. In one example, a depth of the relief channel below the first surface of the substrate can be at most equal to the maximum width of the opening. In an exemplary embodiment, a depth of the relief channel below the first surface of the substrate can be at most half the maximum width of the opening. In a particular example, the relief channel can be an inner relief channel, the substrate can have a dielectric material, and a first surface of the dielectric material can be exposed at and can define the inner wall of the opening. The substrate can have an outer relief channel adjacent the first surface of the substrate and adjacent a second surface of the dielectric material opposite the first surface thereof.

In one embodiment, a depth of the outer relief channel below the first surface of the substrate can be greater than a depth of the inner relief channel below the first surface of the substrate. In a particular embodiment, the component can also include a dielectric material disposed within the outer relief channel. In one example, the relief channel can be one relief channel of a plurality of discrete relief channels separated from one another by a portion of material of the conductive via. In an exemplary embodiment, the plurality of discrete relief channels together can extend across at least 50% of the circumference of the conductive via. In a particular example, the plurality of discrete relief channels can include at least one ring-shaped channel.

In one embodiment, the relief channel can extend around the entire circumference of the conductive via. In a particular example, a portion of the inner wall can be exposed within the relief channel throughout the entire circumference of the conductive via. In an exemplary embodiment, a width of the relief channel in a radial direction from the inner wall in the plane can vary around the circumference of the conductive via. In one example, the plane can be located 5 microns below the first surface. In a particular embodiment, the relief channel can extend to a top surface of a BEOL layer of the component. In one embodiment, a BEOL layer of the component can overlie the relief channel. In a particular example, the relief channel can define a tapered inner edge that is oblique to the first surface of the substrate.

In an exemplary embodiment, the component can also include solder joined to the conductive via within the relief channel. In one example, the component can also include a polymer disposed within the relief channel. In a particular embodiment, the polymer can be completely surrounded by material of the conductive via. In one embodiment, the component can also include a barrier metal layer disposed adjacent the inner wall. In a particular example, a portion of the barrier metal layer can be exposed within the relief channel. In an exemplary embodiment, the component can also include a conductive post extending from a top surface of the conductive via. In one example, the conductive post can consist essentially of at least one of: copper, a copper alloy, and nickel. In a particular embodiment, the conductive post may not overlie the relief channel.

In one embodiment, the conductive post can have a tapered shape, the conductive post having a first width at a base of the conductive post adjacent the top surface of the conductive via and a second width at a tip of the conductive post remote from the top surface, the first and second widths being in a direction parallel to the first surface of the substrate, the second width being different than the first width. In a particular example, at least a portion of the conductive post can have an outer surface defining a curvilinear cross-sectional shape in a plane that is perpendicular to the first surface of the substrate. In an exemplary embodiment, the component can also include a plurality of conductive posts extending from a top surface of the conductive via.

In one example, the conductive via can have a non-circular cross-sectional shape in a plane that is parallel to the first surface of the substrate. In a particular embodiment, the conductive via can have an elongated cross-sectional shape, the conductive via defining a length in a first direction and a width in a second direction transverse to the first direction, the first and second directions being within a plane that is parallel to the first surface of the substrate, the length being greater than the width. In one embodiment, the opening can be a through opening that extends between the first and second surfaces.

In a particular example, the opening can have a tapered shape, the opening having a first width at the first surface and a second width at the second surface, the first and second widths being in a direction parallel to the first surface of the substrate, the first width being less than the second width. In an exemplary embodiment, at least a portion of the opening can be bounded by a surface defining a curvilinear cross-sectional shape in a plane that is perpendicular to the first surface of the substrate.

In one example, the relief channel can be a first relief channel and the plane can be a first plane. The conductive via can also include a second relief channel within the opening adjacent the second surface, the second relief channel having an edge within a second distance from the inner wall in a direction of a second plane parallel to and within five microns below the second surface, the second distance being the lesser of one micron and five percent of a maximum width of the opening in the second plane, the edge of the second relief channel extending along the inner wall to span at least five percent of the circumference of the inner wall.

In a particular embodiment, the conductive via can have an outer contact surface located below the first surface of the substrate. In one embodiment, the component can be configured to reduce stress in the conductive via within the plane below 200 MPa resulting from application of external stress to the conductive via. In a particular example, a system can include a component as described above and one or more additional electronic components electrically connected to the component. In an exemplary embodiment, the system can also include a housing, said component and said additional electronic components being mounted to said housing.

In accordance with another aspect of the invention, a component can include a substrate including a semiconductor region having first and second opposed surfaces, an opening extending within the substrate from the first surface towards the second surface, a solid metal conductive via extending within the opening, and an active device region adjacent the first surface of the semiconductor region. The opening can have an inner wall extending away from the first surface. An inorganic dielectric material can be exposed at the inner wall. The opening can have a maximum width in a direction of a plane parallel to and within five microns below the first surface. At least some active semiconductor devices within the active device region can be within a distance from the inner wall in the plane of three times the maximum width of the opening.

In one example, at least some active semiconductor devices within the active device region can be within a distance from the inner wall in the plane of two times the maximum width of the opening. In a particular embodiment, at least some active semiconductor devices within the active device region can be within a distance from the inner wall in the plane of one times the maximum width of the opening. In one embodiment, the conductive via can define a relief channel within the opening adjacent the first surface, the relief channel having an edge within a first distance from the inner wall in a direction of the plane, the first distance being the lesser of one micron and five percent of the maximum width of the opening in the plane, the edge extending along the inner wall to span at least five percent of a circumference of the inner wall.

In accordance with yet another aspect of the invention, a component can include a substrate including a semiconductor region having first and second opposed surfaces, a plurality of openings each extending within the substrate from the first surface towards the second surface, and a plurality of solid metal conductive vias, each conductive via extending within a respective one of the openings. Each opening can have an inner wall extending away from the first surface and an inorganic dielectric material being exposed at the inner wall. Each opening can have a maximum width in a direction of a plane parallel to and within five microns below the first surface. The plurality of conductive vias can define a minimum pitch in the plane between centers of any two adjacent ones of the conductive vias, the minimum pitch being less than three times the maximum width of each of the openings in which the adjacent conductive vias extend.

In a particular example, the minimum pitch can be less than two times the maximum width of each of the openings in which the adjacent conductive vias extend. In an exemplary embodiment, the minimum pitch can be less than 1.2 times the maximum width of each of the openings in which the adjacent conductive vias extend. In one example, at least some of the conductive vias can each define a relief channel within the respective opening adjacent the first surface. Each relief channel can have an edge within a first distance from the respective inner wall in a direction of the plane, the first distance being the lesser of one micron and five percent of the maximum width of the respective opening in the plane, the edge extending along the respective inner wall to span at least five percent of a circumference of the inner wall.

In accordance with still another aspect of the invention, a component can include a substrate including a semiconductor region having first and second opposed surfaces, an opening extending within the substrate from the first surface towards the second surface, a solid metal conductive via extending within the opening and having an outer contact surface located below the first surface of the substrate in a direction perpendicular to the first surface, and solder joined to the conductive via at the outer contact surface and extending within the opening below the first surface of the substrate. The opening can have an inner wall extending away from the first surface, an inorganic dielectric material being exposed at the inner wall.

In a particular embodiment, the conductive via can define a relief channel within the opening adjacent the outer contact surface. The relief channel can have an edge within a first distance from the inner wall in a direction of a plane parallel to and within five microns below the first surface, the first distance being the lesser of one micron and five percent of a maximum width of the opening in the plane, the edge extending along the inner wall to span at least five percent of a circumference of the inner wall.

In accordance with another aspect of the invention, a component can include a substrate having a first surface, a second surface opposite from the first surface, and an opening extending from the first surface towards the second surface, and a conductive via extending within the opening and defining at least one capillary channel within the opening adjacent the first surface. The opening can have an inner wall extending away from the first surface. At least one of the capillary channels can have an edge within a first distance from the inner wall in a direction of a plane parallel to and within five microns below the first surface, the first distance being the lesser of one micron and five percent of a maximum width of the opening in the plane, the edge extending along the inner wall to span at least five percent of a circumference of the inner wall. Each capillary channel can have a maximum width in the direction in the plane of less than five microns.

In one embodiment, the component can also include solder joined to the conductive via within the at least one capillary channel. In a particular example, the component can also include a conductive post extending from an outer contact surface of the conductive via. In an exemplary embodiment, the conductive post can have at least one capillary channel extending into the conductive post from a base surface thereof. The component can also include solder joining the conductive via and the conductive post and extending within the at least one capillary channels of the conductive via and the conductive post. In one example, the solder may not extend onto the first surface of the substrate.

In accordance with yet another aspect of the invention, a method of fabricating a component can include forming a conductive via extending within an opening in a substrate, the opening extending from a first surface of the substrate towards a second surface opposite from the first surface, and removing material of the conductive via to define a relief channel within the opening adjacent the first surface. The opening can have an inner wall extending away from the first surface, a dielectric material being exposed at the inner wall. The relief channel can have an edge within a first distance from the inner wall in a direction of a plane parallel to and within five microns below the first surface, the first distance being the lesser of one micron and five percent of a maximum width of the opening in the relief plane, the edge extending along the inner wall to span at least five percent of a circumference of the inner wall.

In a particular embodiment, the substrate can have an active device region adjacent the first surface, and the plane can be located below the active device region. In one embodiment, the substrate can consist essentially of the dielectric material. In a particular example, the substrate can consist essentially of glass or ceramic. In an exemplary embodiment, the substrate can consist essentially of a semiconductor material. The method can also include, before the step of forming the conductive via, forming a layer of the dielectric material overlying the substrate material within the opening, the dielectric layer defining the inner wall of the opening.

In one example, the opening can be a through opening that extends between the first and second surfaces. In a particular embodiment, the opening can have a tapered shape, the opening having a first width at the first surface and a second width at the second surface, the first and second widths being in a direction parallel to the first surface of the substrate, the first width being less than the second width. In one embodiment, at least a portion of the opening can be bounded by a surface defining a curvilinear cross-sectional shape in a plane that is perpendicular to the first surface of the substrate. In a particular example, the opening can be formed by isotropic etching of the substrate followed by anisotropic etching of the substrate.

In an exemplary embodiment, the relief channel can be a first relief channel and the plane can be a first plane. The method can also include removing material of the conductive via to define a second relief channel within the opening adjacent the second surface. The second relief channel can have an edge within a second distance from the inner wall in a direction of a second plane parallel to and within five microns below the second surface, the second distance being the lesser of one micron and five percent of a maximum width of the opening in the second plane, the edge of the second relief channel extending along the inner wall to span at least five percent of the circumference of the inner wall.

In one example, the method can also include depositing a polymer material within the relief channel. In a particular embodiment, the step of depositing the polymer material can be performed such that a portion of an outer contact surface of the conductive via is exposed at an outer surface of the polymer. In one embodiment, the method can also include forming an electrically conductive post in contact with the outer contact surface of the conductive via. In a particular example, the electrically conductive post may not overlie at least one of the relief channels. In an exemplary embodiment, the method can also include forming a plurality of electrically conductive posts in contact with the outer contact surface of the conductive via.

BRIEF DESCRIPTION OF THE DRAWINGS

FIGS. 2H and 2I are top plan views illustrating stages of fabrication in accordance with an alternative embodiment of the conductive via shown in FIGS. 1A and 1B.

DETAILED DESCRIPTION

Figure 1A:
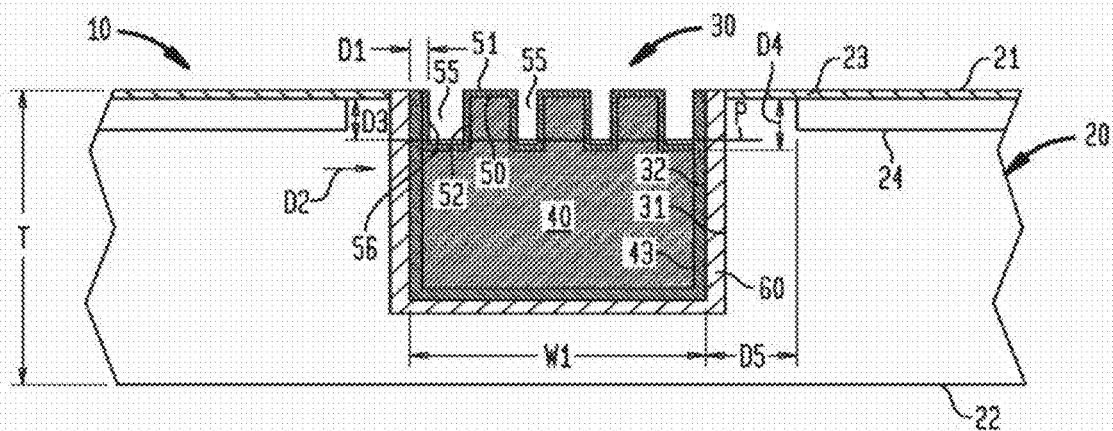
FIGS. 1A and 1B are a side sectional view and a top plan view illustrating a component in accordance with an embodiment of the invention.

As illustrated in FIG. 1A, a component 10 can include a substrate 20 having a first surface 21 and a second surface 22 opposite therefrom, and a conductive via 40 disposed within an opening 30 extending from the first surface towards the second surface.

In some embodiments, the substrate 20 may be a semiconductor chip, a wafer, or the like. The substrate 20 preferably has a coefficient of thermal expansion ("CTE") less than $10 \cdot 10^{-6}/° C.$ (or ppm/° C.). In a particular embodiment, the substrate 20 can have a CTE less than 7 ppm/° C. The substrate 20 may consist essentially of an inorganic material such as silicon. The thickness of the substrate 20 between the first surface 21 and the second surface 22 typically is less than 500 µm, and can be significantly smaller, for example, 130 µm, 70 µm or even smaller. In a particular embodiment, the substrate 20 can be made from a material such as semiconductor material, ceramic, glass, liquid crystal polymer, a composite material such as glass-epoxy or a fiber-reinforced composite, a laminate structure, or a combination thereof.

In one example, the substrate 20 can include a composite material that has an effective CTE that is tunable during fabrication of the substrate to approximately match the CTE of the metal of the conductive vias that extend therein, such as copper or nickel. For example, the substrate 20 can have an effective CTE that is tunable to a value between 10-20 ppm/° C. In a particular embodiment, the substrate 20 can have an effective CTE that is tunable to a value between 15-18 ppm/° C.

In FIG. 1A, the directions parallel to the first surface 21 are referred to herein as "horizontal" or "lateral" directions, whereas the directions perpendicular to the first surface are referred to herein as upward or downward directions and are also referred to herein as the "vertical" directions. The directions referred to herein are in the frame of reference of the structures referred to. Thus, these directions may lie at any orientation to the normal or gravitational frame of reference. A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

As used in this disclosure, a statement that an electrically conductive element is "exposed at" a surface of a substrate indicates that the electrically conductive element is available for contact with a theoretical point moving in a direction perpendicular to the surface of the substrate toward the surface of the substrate from outside the substrate. Thus, a terminal or other conductive element which is exposed at a surface of a substrate may project from such surface; may be flush with such surface; or may be recessed relative to such surface and exposed through a hole or depression in the substrate.

The substrate 20 can further include an insulating dielectric layer 23 overlying the first surface 21 and/or the second surface 22. Such a dielectric layer can electrically insulate conductive elements from the substrate 20. This dielectric layer can be referred to as a "passivation layer" of the substrate 20. The dielectric layer can include an inorganic or organic dielectric material or both. The dielectric layer may include an electrodeposited conformal coating or other dielectric material, for example, a photoimageable polymeric material, for example, a solder mask material.

In embodiments where the semiconductor element 20 includes a semiconductor substrate, made for example from silicon, one or a plurality of semiconductor devices (e.g., transistors, diodes, etc.) can be disposed in an active device region 24 thereof located at and/or below the first surface 21.

In the embodiments described herein, a dielectric layer overlying the first surface 21 and/or the second surface 22 can have a thickness that is substantially less than a thickness of the substrate 20, such that the substrate can have an effective CTE that is approximately equal to the CTE of the material of the substrate, even if the CTE of the dielectric layer is substantially higher than the CTE of the substrate material. In one example, the substrate 20 can have an effective CTE less than 10 ppm/° C.

The substrate 20 can include one or more openings 30 extending from the first surface 21 partially or completely through a thickness T of the substrate towards the second surface 22. In the embodiment shown in FIG. 1A, the opening 30 extends partially through the substrate 20 between the first and second surfaces 21, 22. The openings 30 can be arranged in any top-view geometric configuration, including for example, an m×n array, each of m and n being greater than 1.

Each opening 30 includes an inner surface 31 that extends from the first surface 21 at least partially through the substrate 20 at an angle between 0 and 90 degrees to the horizontal plane defined by the first surface. In one example (e.g., FIG. 8), the inner surface 31 of one or more of the openings 30 can extend between the first surface 21 and the second surface 22. The inner surface 31 can have a constant slope or a varying slope. For example, the angle or slope of the inner surface 31 relative to the horizontal plane defined by the first surface 21 can decrease in magnitude (i.e., become less positive or less negative) as the inner surface penetrates further towards the second surface 22. In a particular embodiment, each opening 30 can be tapered in a direction from the first surface 21 towards the second surface 22. In some examples, each opening 30 can have any three-dimensional shape, including for example, a frusto-conical shape, a cylinder, a cube, a prism, an elliptic paraboloid, a hyperboloid, or a structure bounded by a curvilinear inner surface, among others. As used herein, when a three-dimensional structure is described as having or being bounded by a curvilinear surface, a cross-section of that surface in a plane that is generally perpendicular to the first and second surfaces of the substrate is a curve having a varying slope (e.g., a second order polynomial).

In particular embodiments, the opening 30 and any of the other openings described herein can have various shapes, as described for example in U.S. patent application Ser. Nos. 12/842,717 and 12/842,651, filed Jul. 23, 2010, which are hereby incorporated by reference herein, and such openings can be formed using exemplary processes as described in the aforementioned applications.

The opening 30 can include a conductive via 40 disposed therein and extending from the first surface 21 towards the rear surface 22. In a particular embodiment, first and second conductive vias 40 of a particular component 10 can be connectable to respective first and second electric potentials. The conductive via 40 can include a metal having a relatively high CTE, such as copper, aluminum, tungsten, an alloy including copper, an alloy including nickel, or an alloy including tungsten, among others. In a particular example where a conductive via 40 extends within a substrate 20 that includes a composite material, the substrate can have an effective CTE less than 20 ppm/° C., and the conductive via 40 can extend within a semiconductor region of the substrate. Such a semiconductor region can consist essentially of a material having an effective CTE in a plane of the substrate of no more than 10 ppm/° C.

The component 10 can also include an insulating dielectric layer 60 overlying the inner surface 31 of the opening 30 and extending from the first surface 21 towards the second surface 22, such that the conductive via 40 extends within the insulating dielectric layer. Such an insulating dielectric layer 60 can separate and electrically insulate the conductive via 40 from the material of the substrate 20, at least within the opening 30. The insulating dielectric layer 60 and the insulating dielectric layer 23 can be formed together as a single insulating dielectric layer, or they can be formed separately as individual insulating dielectric layers.

In one example, such an insulating dielectric layer 60 can conformally coat the inner surface 31 exposed within the opening 30. The insulating dielectric material 60 can include an inorganic or organic dielectric material or both. In some embodiments, more than one type of insulating dielectric material can be used, such as silicon dioxide and silicon nitride, or a polymer and a nitride. In a particular embodiment, the insulating dielectric material 60 can include a compliant dielectric material, such that the insulating dielectric material has a sufficiently low modulus of elasticity and sufficient thickness such that the product of the modulus and the thickness provide compliancy.

Figure 1B:
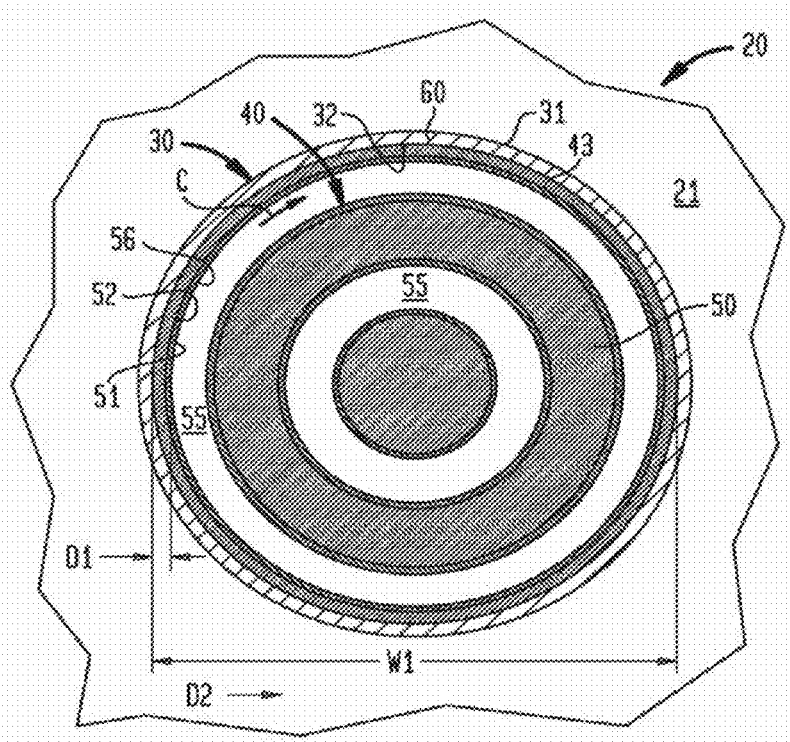

In the embodiment shown in FIGS. 1A and 1B, an inward-facing surface of the insulating dielectric layer 60 defines an inner wall 32 of the opening. In embodiments in which the insulating dielectric layer 60 is omitted, the inner wall 32 of the opening can be coincident with the inner surface 31 of the opening.

In particular embodiments in which the substrate consists essentially of dielectric material (e.g., glass or ceramic), the dielectric layers 60 and/or 23, or any of the other dielectric layer described herein, may be omitted. The dielectric layers 60 and/or 23 may also be omitted in embodiments in which it is desired that the conductive via 40 is not electrically insulated from the material of the substrate 20, for example, when the conductive via is configured to carry a reference potential. In a particular embodiment, for example, when the conductive via 40 is configured to carry a reference potential, the substrate 20 can consist essentially of a semiconductor material, a surface of the semiconductor material can be exposed at and can define the inner wall 32 of the opening, and a portion of the conductive via 40 can be in contact with the semiconductor material within the opening 30.

The opening 30 can further include a layer 43 that can be a barrier metal layer, an adhesion layer, and/or a seed layer extending between the conductive via 40 and the inner wall 32 of the opening (which, in the embodiment of FIGS. 1A and 1B, is an inward-facing surface of the insulating dielectric layer 60). The layer 43 can extend within the opening 30 from the first surface 21 towards the rear surface 22.

The layer 43 can prevent or reduce diffusion of metal from the conductive via 40 into the material of the substrate 20. The layer 43 can function as a barrier layer to avoid transport of material between the conductive via 40 and the insulating layer 60. The layer 43 may also or alternatively serve as an adhesion layer. The layer 43 typically has a thickness of less than 100 nanometers, although the thickness in a particular structure can be greater than or equal to 100 nanometers. The layer 43 can include a metal different than the metal or metals of the conductive via 40. Examples of metals that can be suitable for use in the layer 43 can include nickel, an alloy including nickel, titanium nitride, tantalum nitride, tantalum silicon nitride, tantalum, tungsten silicon nitride, and combinations thereof.

The conductive via 40 can include one or more outer contact surfaces 50 exposed at either or both of the first and second surfaces 21, 22 of the substrate 20 for interconnection with an external element. As shown in FIG. 1A, each outer contact surface 50 can be coated by a layer 51 that can be a barrier metal layer similar to the layer 43 described above.

The conductive via 40 can define one or more relief channels 55 within the opening adjacent the first surface 21 of the substrate 20. In a particular embodiment, such as that shown in FIGS. 1A and 1E, the surfaces of the conductive via 40 that are exposed within the relief channels 55 can be coated by a portion of the layer 51. In some cases, areas of maximum stress in the component 10 can be at or near the first surface 21 of the substrate 20, so the presence of the relief channels 55 at or near the first surface can reduce the maximum stress experienced by the component in the vicinity of the conductive vias 40.

In a conventional component including conductive vias in a semiconductor substrate, it may be necessary to limit the location of active semiconductor devices within an active device region to be at least three conductive via diameters away from any part of the conductive vias. On the other hand, in a component 10 including a conductive via 40 having a relief channel, the reduced maximum stress experienced by the component near the conductive vias can permit a design where an active device region 24 can extend to a location relatively close to a conductive via.

For example, in a particular embodiment of the component 10, an active device region 24 can be located outside of a keep-out zone that extends from the conductive via 40 to a standoff distance D5 away from any part of the conductive via. In one embodiment, the standoff distance D5 can be less than three times a maximum width W1 of the opening 30, the maximum width W1 extending between opposite portions of the inner wall 32. In a particular embodiment, the standoff distance D5 can be less than two times the maximum width W1 of the opening 30. In one example, the standoff distance D5 can be less than the maximum width W1 of the opening 30. In an exemplary embodiment, the standoff distance D5 can be less than one-half the maximum width W1 of the opening 30.

In one embodiment, at least one of the relief channels 55 can have an edge 56 within a first distance D1 from the inner wall that is the lesser of one micron and five percent of the maximum width W1 of the opening 30 in a direction D2 in a relief plane P parallel to the first surface 21 of the substrate 20 and located within a depth D3 of five microns of the first surface. In one embodiment, one or more of the relief channels 55 can extend below the first surface 21 of the substrate 20 to a depth D4 that is at most two times the maximum width W1 of the opening 30. In a particular example, the depth D4 can be at most equal to the maximum width W1 of the opening 30. In one example, the depth D4 can be at most half the maximum width W1 of the opening 30.

The edge 56 of at least one of the relief channels 55 can extend a second distance in a circumferential direction C along the inner wall 32 of at least five percent of a circumference of the inner wall. As shown in FIG. 1B, the edge 56 of the outer one of the relief channels 55 extends around the entire circumference of the inner wall 32, but that need not be the case.

In a particular embodiment, the component 10 having the relief channels 55 can be configured to reduce resulting stress emanating from the conductive via 40 within the relief plane P to a level below 200 MPa when external stress is applied to the component.

Figure 2A:
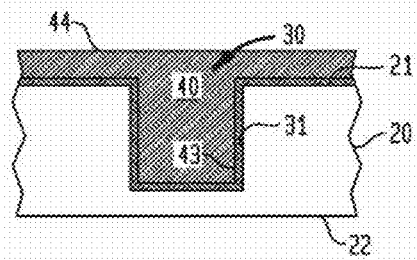
FIGS. 2A-2G are side sectional views illustrating stages of fabrication in accordance with the embodiment depicted in FIGS. 1A and 1B.

A method of fabricating the component 10 (FIGS. 1A and 1B) will now be described, with reference to FIGS. 2A-2G. Referring to FIG. 2A, to form one or more openings 30 extending from the first surface 21 towards the second surface 22 of the substrate 20, material can be removed from the first surface of the substrate.

The opening 30 can be formed for example, by selectively etching the substrate 20, after forming a mask layer where it is desired to preserve remaining portions of the first surface 21. For example, a photoimageable layer, e.g., a photoresist layer, can be deposited and patterned to cover only portions of the first surface 21, after which a timed etch process can be conducted to form the opening 30.

The inner surfaces 31 of the opening 30, extending downwardly from the first surface 21 towards the second surface 22, may be sloped, i.e., may extend at angles other a normal angle (right angle) to the first surface. Wet etching processes, e.g., isotropic etching processes and sawing using a tapered blade, among others, can be used to form an opening 30 having sloped inner surfaces 31. Laser dicing, mechanical milling, among others, can also be used to form an opening 30 having sloped inner surfaces 31.

Alternatively, instead of being sloped, the inner surface 31 of each opening 30 may extend in a vertical or substantially vertical direction downwardly from the first surface 21 substantially at right angles to the first surface (as shown in FIG. 1A). Anisotropic etching processes, laser dicing, laser drilling, mechanical removal processes, e.g., sawing, milling, ultrasonic machining, among others, can be used to form openings 30 having essentially vertical inner surfaces 31.

In a particular embodiment, the opening 30 can be formed, for example, by first using an anisotropic etch process such as a fast DRIE etch or a reactive ion etch to produce an initial opening having a relatively rough initial inner surface, and then using a chemical etch or electropolishing to remove the roughness or scallops extending along the initial inner surface. In one example, the opening 30 can be formed, for example, by isotropic etching of the substrate followed by anisotropic etching of the substrate.

A portion of a passivation layer (e.g., the insulating dielectric layer 23 shown in FIG. 1A) overlying the first surface 21 of the substrate 20 can also be removed during the formation of the opening 30, and such portion can be etched through during the etching of the substrate, or as a separate etching step. Etching, laser drilling, mechanical milling, or other appropriate techniques can be used to remove the portion of such a passivation layer.

After formation of the opening 30, the insulating dielectric layer 60 shown in FIG. 1A can be deposited overlying or coating the inner surfaces 31 of the opening 30, such that the conductive via 40 will extend within the insulating dielectric layer when it is deposited within the opening. As described above, the dielectric layers 23 and 60 can be deposited in a single process. In order to simplify the figures used in describing the method of forming the component 10, the insulating dielectric layers 23 and 60 are not shown in FIGS. 2A-2G.

In a particular embodiment, a mask can be applied to portions of the first surface 21 of the substrate 20 having openings 30 in which it is desired not to form such an insulating dielectric layer 60. Such uncoated ones of the openings 30 can be later filled with conductive vias 40 that have portions directly contacting material of the substrate 20. Such a conductive via 40 can be electrically coupled to a ground electric potential. In a particular embodiment in which the substrate consists essentially of dielectric material (e.g., glass or ceramic), the dielectric layers 60 and/or 23, or any of the other dielectric layers described herein, may be partially or entirely omitted. In such embodiments having one or more openings 30 without dielectric layers 60 and/or 23, the inner wall 32 of such an opening 30 can be coincident with the inner surface 31 of the opening.

Various methods can be used to form such an insulating dielectric layer 60 overlying the inner surfaces 31 of the opening 30, and such methods are described below. In particular examples, chemical vapor deposition (CVD) or atomic layer deposition (ALD) can be used to deposit a thin insulating dielectric layer overlying the inner surfaces 31 of the openings 30. In one example, tetraethylorthosilicate (TEOS) can be used during a low-temperature process for depositing such an insulating dielectric layer. In exemplary embodiments, a layer of silicon dioxide, borophosphosilicate glass (BPSG), borosilicate glass (BSG), or phosphosilicate glass (PSG) can be deposited overlying the inner surfaces 31 of the openings 30, and such glass can be doped or undoped.

In one example, a flowable dielectric material can be applied to the first surface 21 of the substrate 20, and the flowable material can then more evenly distributed across the inner surfaces 31 of the opening 30 during a "spin-coating" operation, followed by a drying cycle which may include heating. In another example, a thermoplastic film of dielectric material can be applied to the first surface 21 after which the assembly is heated, or is heated in a vacuum environment, i.e., placed in an environment under lower than ambient pressure.

In still another example, the assembly including the substrate 20 can be immersed in a dielectric deposition bath to form a conformal dielectric coating or insulating dielectric material 60. As used herein, a "conformal coating" is a coating of a particular material that conforms to a contour of the surface being coated, such as when the insulting dielectric material 60 conforms to a contour of the inner surfaces 31 of the opening 30. An electrochemical deposition method can be used to form the conformal dielectric material 60, including for example, electrophoretic deposition or electrolytic deposition.

In one example, an electrophoretic deposition technique can be used to form a conformal dielectric coating, such that the conformal dielectric coating is only deposited onto exposed conductive and semiconductive surfaces of the assembly. During deposition, the semiconductor device wafer is held at a desired electric potential and an electrode is immersed into the bath to hold the bath at a different desired potential. The assembly is then held in the bath under appropriate conditions for a sufficient time to form an electrode-posited conformal dielectric material 60 on exposed surfaces of the substrate that are conductive or semiconductive, including but not limited to along the inner surfaces 31 of the opening 30. Electrophoretic deposition occurs so long as a sufficiently strong electric field is maintained between the surface to be coated thereby and the bath. As the electrophoretically deposited coating is self-limiting in that after it reaches a certain thickness governed by parameters, e.g., voltage, concentration, etc. of its deposition, deposition stops.

Electrophoretic deposition forms a continuous and uniformly thick conformal coating on conductive and/or semiconductive exterior surfaces of the substrate 20. In addition, the electrophoretic coating can be deposited so that it does not form on a remaining passivation layer 23 overlying the first surface 21 of the substrate 20, due to its dielectric (nonconductive) property. Stated another way, a property of electrophoretic deposition is that it does not normally form on a layer of dielectric material, and it does not form on a dielectric layer overlying a conductor provided that the layer of dielectric material has sufficient thickness, given its dielectric properties. Typically, electrophoretic deposition will not occur on dielectric layers having thicknesses greater than about 10 microns to a few tens of microns. A conformal dielectric material 60 can be formed from a cathodic epoxy deposition precursor. Alternatively, a polyurethane or acrylic deposition precursor could be used. A variety of electrophoretic coating precursor compositions and sources of supply are listed in Table 1 below.

TABLE 1

| ECOAT NAME | POWERCRON 645 | POWERCRON 648 | CATHOGUARD 325 |
|---|---|---|---|
| MANUFACTURERS | | | |
| MFG | PPG | PPG | BASF |
| TYPE | CATHODIC | CATHODIC | CATHODIC |
| POLYMER BASE | EPOXY | EPOXY | EPOXY |
| LOCATION | Pittsburgh, PA | Pittsburgh, PA | Southfield, MI |
| APPLICATION DATA | | | |
| Pb/Pf-free | Pb-free | Pb or Pf-free | Pb-free |
| HAPs, g/L | | 60-84 | COMPLIANT |
| VOC, g/L (MINUS WATER) | | 60-84 | <95 |
| CURE | 20 min/175 C. | 20 min/175 C. | |
| FILM PROPERTIES | | | |
| COLOR | Black | Black | Black |
| THICKNESS, μm | 10-35 | 10-38 | 13-36 |
| PENCIL HARDNESS | | 2H+ | 4H |
| BATH CHARACTERISTICS | | | |
| SOLIDS, % wt. | 20 (18-22) | 20 (19-21) | 17.0-21.0 |
| pH (25 C.) | 5.9 (5.8-6.2) | 5.8 (5.6-5.9) | 5.4-6.0 |
| CONDUCTIVITY (25 C.) μS | 1000-1500 | 1200-1500 | 1000-1700 |
| P/B RATIO | 0.12-0.14 | 0.12-0.16 | 0.15-0.20 |
| OPERATION TEMP., C. | 30-34 | 34 | 29-35 |
| TIME, sec | 120-180 | 60-180 | 120+ |
| ANODE | SS316 | SS316 | SS316 |
| VOLTS | | 200-400 | >100 |

| ECOAT NAME | ELECTROLAC | LECTRASEAL DV494 | LECTROBASE 101 |
|---|---|---|---|
| MANUFACTURERS | | | |
| MFG | MACDERMID | LVH COATINGS | LVH COATINGS |
| TYPE | CATHODIC | ANODIC | CATHODIC |
| POLYMER BASE | POLYURETHANE | URETHANE | URETHANE |
| LOCATION | Waterbury, CT | Birmingham, UK | Birmingham, UK |
| APPLICATION DATA | | | |
| Pb/Pf-free | | Pb-free | Pb-free |
| HAPs, g/L | | | |
| VOC, g/L (MINUS WATER) | | | |
| CURE | 20 min/149 C. | 20 min/175 C. | 20 min/175 C. |
| FILM PROPERTIES | | | |
| COLOR | Clear (+dyed) | Black | Black |
| THICKNESS, μm | | 10-35 | 10-35 |
| PENCIL HARDNESS | 4H | | |
| BATH CHARACTERISTICS | | | |
| SOLIDS, % wt. | 7.0 (6.5-8.0) | 10-12 | 9-11 |
| pH (25 C.) | 5.5-5.9 | 7-9 | 4.3 |
| CONDUCTIVITY (25 C.) μS | 450-600 | 500-800 | 400-800 |
| P/B RATIO | | | |
| OPERATION TEMP., C. | 27-32 | 23-28 | 23-28 |
| TIME, sec | | | 60-120 |
| ANODE | SS316 | 316SS | 316SS |
| VOLTS | 40, max | | 50-150 |

In another example, the dielectric material 60 can be formed electrolytically. This process is similar to electrophoretic deposition, except that the thickness of the deposited layer is not limited by proximity to the conductive or semi-conductive surface from which it is formed. In this way, an electrolytically deposited dielectric layer can be formed to a thickness that is selected based on requirements, and processing time is a factor in the thickness achieved.

As shown in FIG. 2A, the layer 43 can then be formed overlying the inner surfaces 31 of the opening 30 (and the insulating dielectric layers 60 and 23 if they are present). For example, the layer 43 or portions of the layer 43 can be formed using atomic layer deposition (ALD), physical vapor deposition (PVD), or electroless or electrolytic deposition methods. Then, the conductive via 40 can be formed overlying and electrically coupled to the layer 43. As shown, material of the layer 43 and the conductive via 40 can be deposited onto portions of the first surface 21 that are outside of the opening 30.

To form any one of the layer 43 and the conductive via 40, an exemplary method involves depositing a metal layer by one or more of sputtering a primary metal layer onto exposed surfaces of the insulating dielectric layers 60 and/or 23, plating, or mechanical deposition. Mechanical deposition can involve the directing a stream of heated metal particles at high speed onto the surface to be coated. In other embodiments, sub-micron metal powder can be screened or selectively screened into the cavities, for example, using a pulse laser, and the metal flow will fill the cavities. This step can be performed by blanket deposition onto the insulating dielectric layers 60 and/or 23, for example.

Figure 2B:
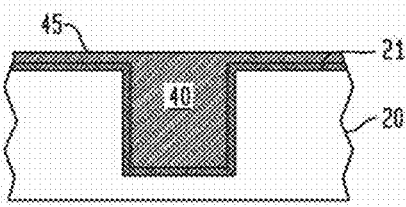

Referring now to FIG. 2B, an initial exposed surface 44 (FIG. 2A) of the conductive via 40 can be planarized so that the resulting exposed surface 45 is closer to the first surface 21 of the substrate 20. The initial exposed surface 44 of the conductive via 40 can be planarized by various exemplary methods. In one embodiment, a grinding process can be used, for example, to planarize the initial exposed surface 44. The grinding process can remove both a portion of the material of the conductive via 40 above the first surface 21 of the substrate 20. The initial exposed surface 44 can also be planarized by lapping, polishing, or by high-precision milling.

In a particular example, chemical mechanical polishing ("CMP") can be used to planarize the initial exposed surface 44 of the conductive via 40. An exemplary CMP process can include sanding the initial exposed surface 44 with an abrasive pad, using a slurry. Such a slurry can typically include an oxidizing agent and a passivation agent. An exemplary CMP process can include using an abrasive slurry, including, for example, a micro-silica paste, to planarize the initial exposed surface 44.

Figure 2C:
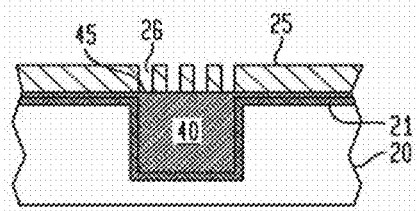

Referring now to FIG. 2C, a mask layer 25 can be formed overlying an exposed surface 45 of the conductive via 40 at the first surface 21 of the substrate 20. The mask layer 25 can have gaps 26 at the areas of the exposed surface 45 where it is desired to form the relief channels 55 and the outer contact surfaces 50 adjacent the relief channels. For example, a photoimageable layer, e.g., a photoresist layer, can be deposited and patterned to cover portions of the exposed surface 45.

Figure 2D:
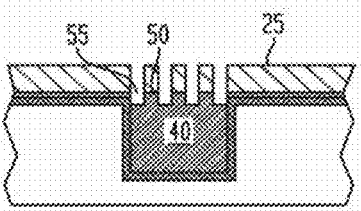

As shown in FIG. 2D, material of the conductive via 40 can be removed from the exposed surface 45 at the gaps 26 within the mask layer 25, thereby forming the relief channels 55 and the outer contact surfaces 50. Portions of the material of the conductive via 40 can be removed, for example, using an etching process or any of the other material removal processes described above with reference to forming the opening 30.

Figure 2E:
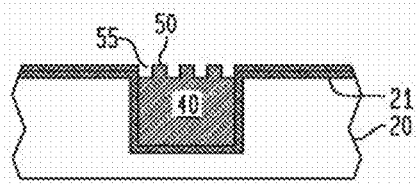
Figure 2F:
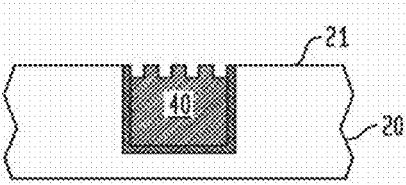

Referring now to FIG. 2E, the mask layer 25 (FIG. 2D) can be removed, leaving the relief channels 55 and the outer contact surfaces 50 adjacent the relief channels. In FIG. 2F, if it is desired to remove excess metal of the layer 43 and/or the conductive via 40 that overlies the first surface 21 of the substrate 20 outside of the opening 30, such excess metal can be removed via any of the removal processes described above with reference to forming the opening 30 or planarizing the initial exposed surface 44 of the conductive via 40.

Figure 2G:
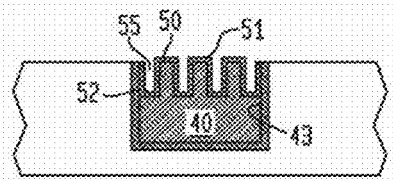

Then, as shown in FIG. 2G, the outer contact surfaces 50 and the exposed surfaces 52 of the relief channels 55 can be coated by a layer 51 that can be a barrier metal layer similar to the layer 43 described above, a passivation layer, or a coupling layer such as an adhesion layer to make the via 40 configured to receive an additional conductive layer thereon. Such a layer 51 can be deposited via any of the metal deposition processes described above with reference to the conductive via 40 or the layer 43.

In one alternative method, material of the conductive via 40 can be removed from the exposed surface 45 without using a mask layer 25 as shown in FIG. 2C. In such a method, the exposed surface 45 of the conductive via 40 can be polished, for example, using a CMP process as described above, until the interface between the conductive via and the layer 43 (e.g, a barrier metal layer) is exposed at the first surface 21 of the substrate 20. Then, the exposed surface 45 can be etched. Etching of the exposed surface 45 of conductive via 40 can progress more quickly at the interface between the conductive via and the layer 43 than at, other portions of the exposed surface, thereby forming a channel 55 within the conductive via adjacent to this interface. An example conductive via 940a resulting from this alternative method is shown and described below with reference to FIG. 9A. After the channel 55 is formed, the method can proceed as described above with reference to FIG. 2G.

In another alternative method, shown in FIGS. 2H and 2I, material of a conductive via 40' can be deposited into the opening 30 such that one or more channel portions or voids 55' are formed at the radial periphery 40a of the conductive via adjacent the outer contact surface 50'. As shown in FIG. 2H, an insulating dielectric layer 60 such as that described above with reference to FIG. 1A can be deposited overlying or coating the inner surfaces 31 of the opening 30. Then, a barrier layer 43a can be formed as described above overlying the dielectric layer 60, and a seed layer 43b can be formed overlying the barrier layer 43a. A mask layer can be applied to an exposed surface of the seed layer 43b at the first surface 21, the mask layer can be patterned, and the seed layer can be etched to form gaps 43c in the seed layer between adjacent portions of the mask layer. The gaps 43c can extend down below the first surface 21 to a desired depth, such as the depth D4 shown in FIG. 1A. As can be seen in FIG. 2H, there can be a plurality of discontinuous gaps 43c distributed in a circumferential direction C along the seed layer 43b, but that need not be the case.

As shown in FIG. 2I, the conductive via 40' can then be formed overlying and electrically coupled to the seed layer 43b. The metal of the conductive via 40' will deposit more quickly on the seed layer 43b than on the portions of the barrier layer 43a exposed within the gaps 43c, so that as the conductive via is formed, the gaps will become channel portions or voids 55'. As can be seen in FIG. 2I, there can be a plurality of discontinuous channel portions 55' distributed in the circumferential direction C about the radial periphery 40a of the conductive via 40', but that need not be the case. In a particular example, the channel portions 55' can have a width W4 in a radial direction R of less than one micron. In an exemplary embodiment, the width W4 can be less than 0.5 microns.

Figure 3A:
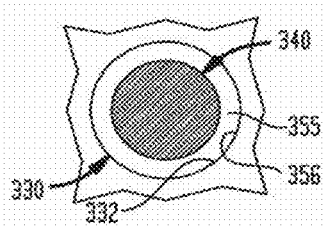
FIGS. 3A and 3B are a top plan view and a side sectional view illustrating an alternative embodiment of the conductive via shown in FIGS. 1A and 1B.
Figure 3B:
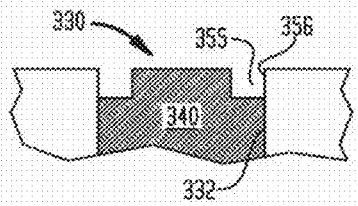

FIGS. 3A through 6C illustrate variations of the conductive via 40 of FIGS. 1A and 1B having alternate configurations. In order to simplify the figures, the optional insulating dielectric layers 23 and 60 and the optional barrier layers 43 and 51 shown in FIG. 1A are not shown in FIGS. 3A through 6C. The conductive via 340 shown in FIGS. 3A and 3B is the same as the conductive via 40 described above, except that the conductive via 340 includes a single relief channel 355 having an edge 356 extending around the entire circumference of the inner wall 332 of the opening 330.

Figure 4A:
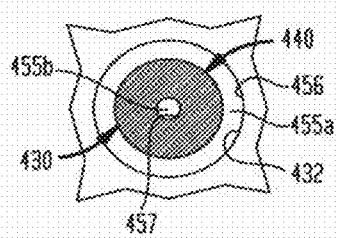
FIGS. 4A and 4B are a top plan view and a side sectional view illustrating another alternative embodiment of the conductive via shown in FIGS. 1A and 1B.
Figure 4B:
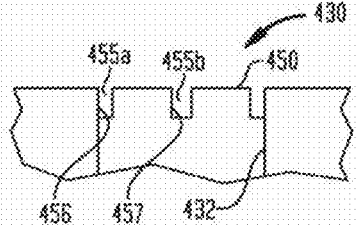

The conductive via 440 shown in FIGS. 4A and 4B is the same as the conductive via 40 described above, except that the conductive via 440 includes a first relief channel 455a having an edge 456 extending around the entire circumference of the inner wall 432 of the opening 430, and a second relief channel 455b located approximately at the center of the conductive via 440. The second relief channel 455b can be a relief region having only a single outer edge 457, such that no portion of the outer contact surfaces 450 is located within the area circumscribed by the outer edge 457.

Figure 5A:
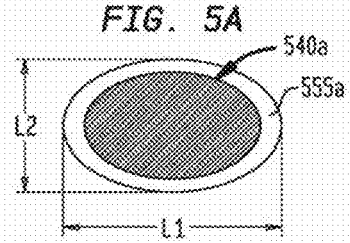
FIGS. 5A-5C and 6A-6C are top plan views illustrating further alternative embodiments of the conductive via shown in FIGS. 1A and 1B.

The conductive via 540a shown in FIG. 5A is the same as the conductive via 340 described above with respect to FIGS. 3A and 3B, except that the conductive via 540a includes a relief channel 553a having an oblong or oval shape, wherein the relief channel defines a first dimension L1 that is greater than a second dimension L2, the first and second dimensions being located in the relief plane P shown and described with respect to FIG. 1A. As shown in FIG. 5A, the conductive via 540a can have an oblong or oval cross-sectional shape in a plane generally parallel to the first surface of the substrate. In other embodiments, the invention contemplates other cross-sections of conductive vias having relief channels, including for example, square, rectangular, triangular, hexagonal, non-circular, curvilinear, or any other shape.

Figure 5B:
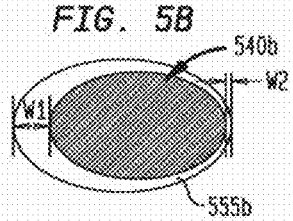

The conductive via 540b shown in FIG. 5B is the same as the conductive via 540a described above with respect to FIG. 5A, except that the relief channel 555b of the conductive via 540b has a first width W2 at a first side of the conductive via that is greater that a second width W3 at a second opposite side of the conductive via, the first and second widths being located in the relief plane P shown in FIG. 1A.

Figure 5C:
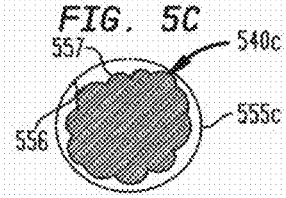

The conductive via 540c shown in FIG. 5C is the same as the conductive via 340 described above with respect to FIGS. 3A and 3B, except that the conductive via 540c includes a relief channel 555c having an irregularly-shaped inner edge 551 opposite the outer edge 556. In other embodiments, the invention contemplates relief channels having other inner edge shapes, including for example, square, rectangular, triangular, hexagonal, curvilinear, or any other shape.

Figure 6A:
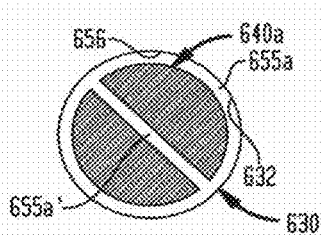

The conductive via 640a shown in FIG. 6A is the same as the conductive via 340 described above with respect to FIGS. 3A and 3B, except that the conductive via 640a includes a first relief channel 655a having an edge 656 extending around the entire circumference of the inner wall 632 of the opening 630, and a second relief channel 655a' extending through the center of the conductive via 640 between opposing sides of the first relief channel.

Figure 6B:
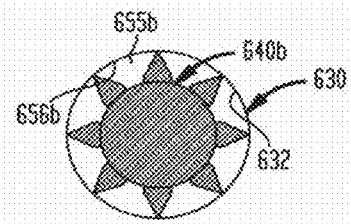

The conductive via 640b shown in FIG. 63 is the same as the conductive via 340 described above with respect to FIGS. 3A and 3B, except that the conductive via 640b includes a plurality of discrete relief channels 655b separated from one another along the circumference of the inner wall 632 of the opening 630, the relief channels 655b being distributed about the circumference of the inner wall of the opening. Each of the discrete relief channels 655b defines an edge 656b that extends around a portion of the circumference of the inner wall 632 of the opening 630. As shown in FIG. 6B, the conductive via 640b can have eight relief channels 655b. In other embodiments, the conductive via 640b can have any number of relief channels 655b, including, for example, two, three, four, six, ten, twelve, or twenty relief channels.

Figure 6C:
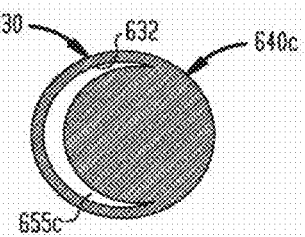

The conductive via 640c shown in FIG. 6C is the same as the conductive via 340 described above with respect to FIGS. 3A and 3B, except that the conductive via 640c includes a relief channel 655c that only extends around a portion of the circumference of the inner wall 632 of the opening 630. As shown in FIG. 6C, the relief channel 655c can extend around approximately 50% of the circumference of the inner wall 632 of the opening 630. In other examples, the relief channel 655c can extend around any portion of the circumference of the inner wall 632 of the opening 630, including, for example, 5%, 10%, 20%, 33%, 66%, or 75%.

Figure 7:
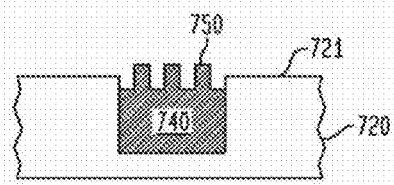
FIG. 7 is a side sectional view illustrating a component in accordance with yet another embodiment of the invention.

FIGS. 7 through 12 illustrate further variations of the conductive via 40 of FIGS. 1A and 1B having alternate configurations. Similar to FIGS. 3A through 6C, the optional insulating dielectric layers 23 and 60 and the optional barrier layers 43 and 51 are not shown in FIGS. 7 through 12, except that FIG. 9A shows a barrier layer 943, and FIG. 10B shows a barrier layer 1051. The conductive via 140 shown in FIG. 7 is an alternative side sectional view of the conductive via 40 shown in FIG. 1B. The conductive via 740 has outer contact surfaces 750 that extend above the first surface 721 of the substrate 720.

Figure 8:
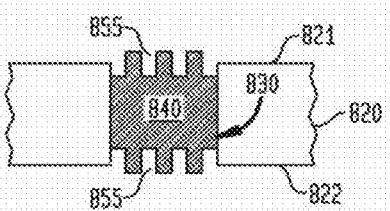
FIG. 8 is a side sectional view illustrating an alternative embodiment of the component shown in FIG. 7, having reduces stress structures at the first and second surfaces of the component.

FIG. 8 shows a variation of the conductive via of FIG. 7 having relief channels 855 in both ends of the conductive via 840 at each of the respective first and second surfaces 821, 822 of the substrate 820. The conductive via 840 is disposed in a through-opening 830 that extends through a thickness of the substrate 820 from the first surface 821 to the second surface 822. In a particular embodiment (not shown), a conductive via having relief channels in only one end of the conductive via can be disposed within a through-opening. In such an embodiment, the other end of the conductive via that does not contain the relief channels can have any configuration, including, for example, a flat conductive contact surface or a conductive post exposed at the respective surface of the substrate.

Figure 9A:
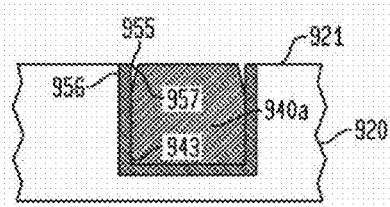
FIGS. 9A, 9B, and 9C are side sectional views illustrating alternative embodiments of the component shown in FIGS. 1A and 1B, having sloped relief channels.
Figure 9B:
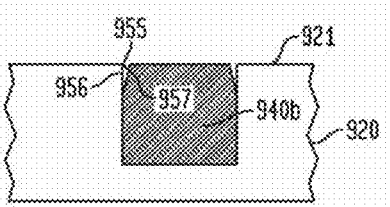

FIGS. 9A and 9B show conductive vias 940a and 940b, respectively. The conductive vias 940a and 940b are the same as the conductive via 340 described above with respect to FIGS. 3A and 3B, except that the conductive vias 940a and 940b each include a relief channel 955 having a tapered inner edge 957, the tapered inner edge not being perpendicular to the first surface 921 of the substrate 920. In the embodiments shown in FIGS. 9A and 9B, the tapered inner edge 957 is not parallel to the outer edge 956 of the relief channel 955, and the outer edge 956 is perpendicular to the first surface 921 of the substrate 920. The conductive via 940a of FIG. 9A has a barrier or seed layer 943 (such as the layer 43 described above) surrounding the conductive via, while the conductive via 940b of FIG. 9B is shown without such a barrier or seed layer.

Figure 9C:
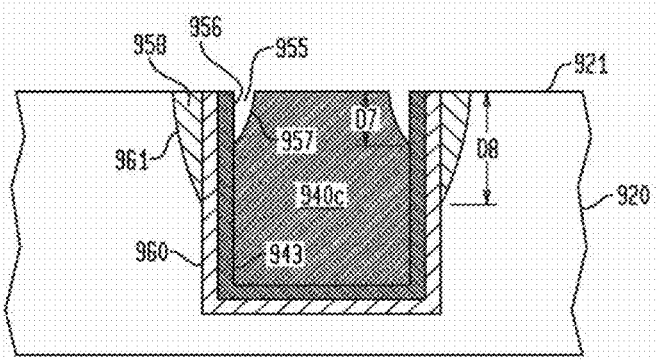

FIG. 9C shows a conductive via 940c that is the same as the conductive via 940a described above with respect to FIG. 9A, except that the substrate 921 also includes an outer relief channel 958 adjacent an insulating dielectric layer 960. In one example, the outer relief channel 958 can be tilled with a low-k insulating dielectric material 961 such as that commonly used in semiconductor manufacturing. Other dielectric materials 961 may be deposited to fill the outer relief channel 958 which, in some cases, may have a Young's modulus lower than the Young's modulus of the material of the substrate 920 (e.g., semiconductor material) or the material of the insulating dielectric layer 960, such that a degree of compliancy is achieved. The outer relief channel 958 can extend to a depth D8 below the first surface 921 of the substrate 920. In a particular embodiment, the depth D8 to which the outer relief channel 958 extends can be greater than a depth D7 to which the relief channel 955 extends below the first surface 921 of the substrate 920, although that need not be the case.

In one example, the outer relief channel 958 can be etched into a portion of the substrate 920 adjacent the insulating dielectric layer 960. In an exemplary embodiment, the outer relief channel 958 can be etched into both a portion of the substrate 920 and a portion of the insulating dielectric layer 960. In a particular example, the outer relief channel 958 can be etched into the substrate 920 using reactive ion etching, and the relief channel 955 can be etched into the material of the conductive via 940c using a chemical etching process. The outer relief channel 958 can be a single continuous relief channel, or it can be a plurality of discrete relief channels 958 separated from one another along the outer circumference of the insulating dielectric layer 960, the relief channels 950 being distributed about the outer circumference of the insulating wall 960.

Figure 10A:
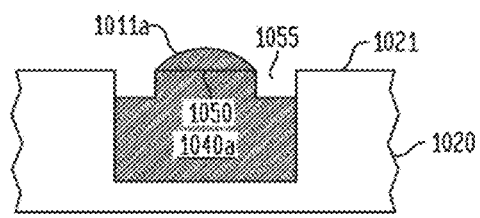
FIGS. 10A and 10B are side sectional views illustrating alternative embodiments of the component shown in FIGS. 1A and 1B, having conductive joining material at the first surface of the component.
Figure 10B:
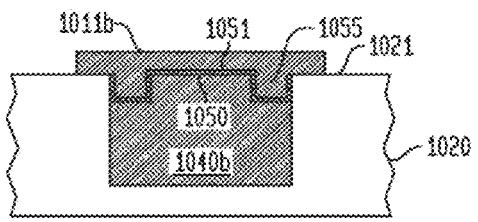

FIGS. 10A and 10B show conductive vias 1040a and 1040b, respectively. The conductive vias 1040a and 1040b are the same as the conductive via 340 described above with respect to FIGS. 3A and 3B, except that the conductive vias 1040a and 1040b each include a conductive joining material (e.g., solder, a conductive adhesive, or a conductive paste) overlying at least the outer contact surface 1050 of the conductive via.

Connection between the conductive vias 1040a or 1040b (or any of the other conductive elements described herein) and components external to the substrate 1020 can be through the respective conductive joining material 1011a or 1011b. Such conductive joining material can comprise a fusible metal having a relatively low melting temperature, e.g., solder, tin, or a eutectic mixture including a plurality of metals. Alternatively, such conductive joining material can include a wettable metal, e.g., copper or other noble metal or non-noble metal having a melting temperature higher than that of solder or another fusible metal. Such wettable metal can be joined with a corresponding feature, e.g., a fusible metal feature of an interconnect element. In a particular embodiment, such conductive joining material can include a conductive material interspersed in a medium, e.g., a conductive paste, e.g., metal-filled paste, solder-filled paste or isotropic conductive adhesive or anisotropic conductive adhesive.

The conductive via 1040a of FIG. 10A has a conductive joining material 1011a adjacent the outer contact surface 1050 of the conductive via, but the conductive joining material does not extend into the relief channel 1055. In embodiments such as that shown in FIG. 10A where the relief channel 1055 is left unfilled, when the conductive via 1040a is joined with another conductive element, the relief channel 1055 can serve as a moat to receive excess conductive joining material 1011a that can be squeezed out from between the outer contact surface 1050 and a confronting contact surface of another conductive element.

Having excess conductive joining material 1011a flow into the relief channel 1055 can help to prevent the conductive joining material from flowing onto the first surface 1021 of the substrate 1020 and potentially shorting out adjacent conductive vias 1040a (i.e., creating a direct electrically conductive path between adjacent conductive vias). By reducing the tendency of excess conductive joining material 1011a to flow onto the first surface 1021 of the substrate 1020, adjacent conductive vias 1040a can be spaced closer together without having adjacent conductive vias short out. Such a design can improve reliability of the component for a given spacing or pitch between adjacent conductive vias. Also, such a design can allow a reduced pitch (spacing between) of bonding structures such as conductive posts or exposed pads of the conductive vias 1040a, without having excess conductive joining material 1011a short out adjacent ones of the bonding structures.

The conductive via 1040b of FIG. 10B has a conductive joining material 1011b overlying the outer contact surface 1050, overlying a portion of the first surface 1021 of the substrate 1020, and extending into the relief channel 1055. The conductive via 1040b also has a barrier layer 1051 (such as the layer 51 described above) that can extend between the conductive via and the conductive joining material 1011b.

Figure 11A:
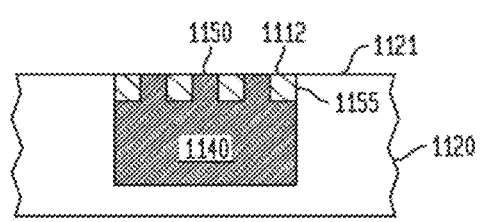
FIG. 11A is a side sectional view illustrating a component in accordance with still another embodiment of the invention.

The conductive via 1140 shown in FIG. 11A is the same as the conductive via 40 described above with respect to FIGS. 1A and 1B, except that the conductive via 1140 has a low stress material 1112 disposed in the relief channels 1155 at the first surface 1121 of the substrate 1120. The low stress material 1112 can be conductive (e.g., solder or a conductive adhesive paste), nonconductive (e.g., a polymer or another dielectric material), or a porous conductive or nonconductive material such as a polymer foam. Such a material can have a low modulus of elasticity, or the material can have enough collapsible pores that can compress under a load.

In one example, one or more of the relief channels 1155 can be capillary channels, each capillary channel having a maximum width in a direction in the relief plane P shown and described with respect to FIG. 1A of less than five microns. In an embodiment where the low stress material 1112 is solder, such capillary channels can draw solder away from the outer contact surface 1150 of the conductive via 1140 when another conductive structure (e.g., the conductive post 2741b shown in FIG. 27B) is joined to the conductive via, such that a reduced volume of solder can be used to join the conductive via and the conductive structure to one another. The presence of the capillary channels can prevent solder from being squeezed out onto the first surface 1121 when another conductive structure is joined to the conductive via 1140.

Figure 27A:
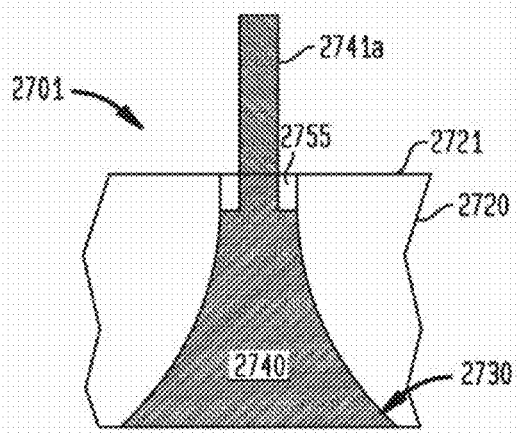
FIGS. 27A-27D are side sectional views illustrating alternative embodiments of the component shown in FIG. 21A.
Figure 27B:
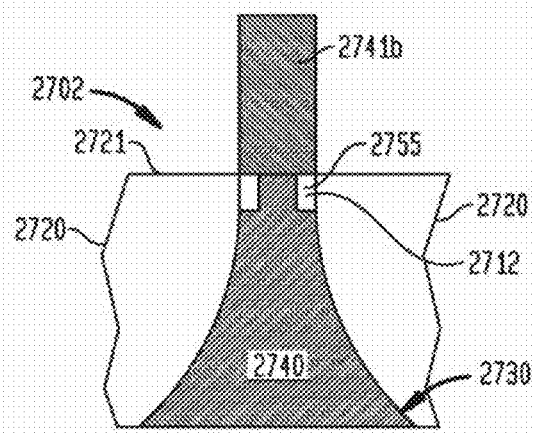

In an example where a conductive post such as the conductive post 2741b shown in FIG. 27B is joined to the conductive via 1140, a base of the conductive post can be joined to the outer contact surface 1150 of the conductive via. Such a conductive post can have at least one capillary channel extending into the conductive post from a base surface thereof adjacent the outer contact surface 1150. In such an embodiment, the capillary channels in both the conductive via 1140 and the conductive post joined thereto can draw solder away from the interface between the conductive via and the conductive post, and a reduced volume of solder can be used to join the conductive via and the conductive post to one another. The presence of the capillary channels in both the conductive via and the conductive post can prevent solder from extending onto the first surface 1121 when the conductive post is joined to the conductive via 1140.

Figure 11B:
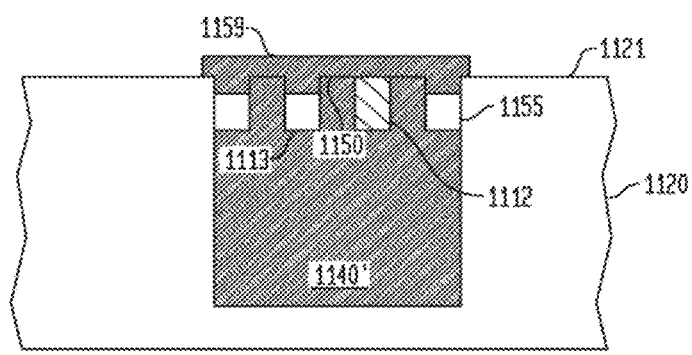
FIG. 11B is a side sectional view illustrating an alternative embodiment of the component shown in FIG. 11A, having a conductive pad at the first surface of the component.

The conductive via 1140' shown in FIG. 11B is the same as the conductive via 1140 described above with respect of FIG. 11A, except that the conductive via 1140' has a conductive pad 1159 overlying the relief channels 1155 and the outer contact surface 1150 at the first surface 1121 of the substrate 1120. Such a conductive pad 1159 can be exposed at the first surface 1121 of the substrate 1120 for interconnection with a conductive element of another component. As shown in FIG. 11B, the conductive pad 1159 can completely seal the relief channels 1155 at the first surface 1121. In some embodiments, the conductive pad 1159 can partially seal one or more of the relief channels 1155.

In a particular example, the conductive pad 1159 can seal one or more of the relief channels 1155 at the first surface 1121, enclosing a void 1113 within at least some of the sealed relief channels. In one embodiment, also illustrated in FIG. 11B, a low stress material 1112, such as solder or a polymer, can fill one or more of the relief channels 1155 that are sealed by the conductive pad 1159. The conductive pad 1159 can be plated onto the outer contact surface 1150 and across the relief channels 1155, such that the metal material of the conductive pad only partially extends into one or more of the relief channels, as shown in FIG. 11B, thereby leaving voids 1113 within at least some of the relief channels.

Figure 12:
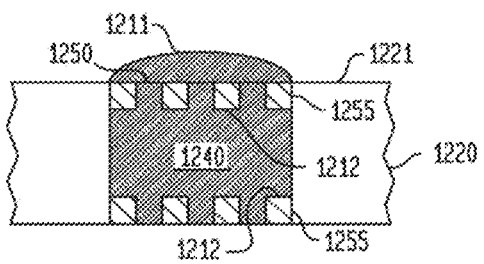
FIG. 12 is a side sectional view illustrating an alternative embodiment of the component shown in FIG. 11A, having conductive joining material at the first surface of the component.

The conductive via 1240 shown in FIG. 12 is the same as the conductive via 1140 described above with respect to FIG. 11A, except that the conductive via 1240 has a low stress material 1212 disposed in relief channels 1255 at both the first surface 1221 and the second surface 1222 of the substrate 1220. The low stress material 1212 can be conductive or nonconductive.

The conductive via 1240 can further include a conductive joining material 1211 overlying the outer contact surfaces 1250, overlying a portion of the first surface 1221 of the substrate 1220, and overlying the low stress material 1212 that is disposed in the relief channels 1255. In a particular embodiment, the conductive joining material 1211 can be the same material as the low stress material 1212, and in such an embodiment, the conductive joining material and the low stress material at the first surface 1221 of the substrate 1220 can be deposited as a single continuous conductive joining material region. In a particular example, the low stress material 1212 can serve to prevent the conductive joining material 1211 from flowing into the relief channels 1255 when an external structure is joined with the conductive via 1240 using the conductive joining material.

In another example, a porous low stress material 1212 can be used to prevent the conductive joining material 1211 from contacting structures at the first surface 1221 of the substrate 1220 that are located near the conductive via 1240. In such an embodiment, when an external structure is joined with the conductive via 1240 using the conductive joining material 1211, the conductive joining material can flow into the pores of the low stress material rather than flowing onto the first surface 1221.

Figure 13:
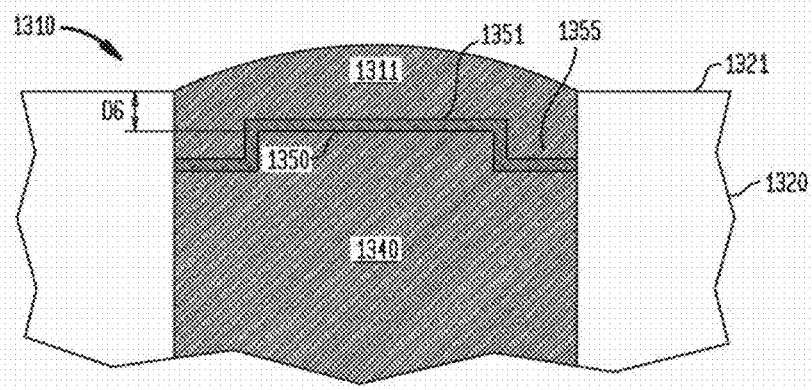
FIG. 13 is a side sectional view illustrating a component in accordance with another embodiment of the invention.

FIG. 13 shows a conductive via 1340 that is the same as the conductive via 340 described above with respect to FIGS. 3A and 3B, except that the conductive via 1340 includes a conductive joining material 1311 overlying the outer contact surface 1350 of the conductive via and extending into the relief channel 1355. The conductive via 1340 also has a barrier layer 1351 (such as the layer 51 described above) that can extend between the conductive via and the conductive joining material 1311. The outer contact surface 1350 can be recessed below the first surface 1321 of the substrate 1320 by a distance D6. In the embodiment shown in FIG. 13, the conductive joining material 1311 does not overlie the first surface 1321 of the substrate 1320.

Similar to the embodiment shown in FIG. 10A, when the conductive via 1340 is joined with another conductive element, having the outer contact surface 1350 of the conductive via recessed below the first surface 1321 of the substrate 1320 can help prevent the conductive joining material 1311 from flowing onto the first surface and potentially shorting out adjacent conductive vias 1340. In the example shown in FIG. 13, the conductive joining material 1311 extends above the first surface 1321 of the substrate 1320, but that need not be the case. For example, in other embodiments, the conductive joining material 1311 may have an exposed surface that is recessed below the first surface 1321 of the substrate 1320. Similar to FIGS. 3A through 6C, the optional insulating dielectric layers 23 and 60 and the optional barrier layer 43 is not shown in FIGS. 13 through 14D.

Figure 14A:
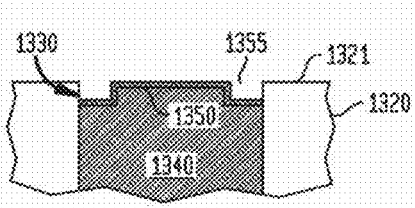
FIGS. 14A-14D are side sectional views illustrating stages of fabrication in accordance with the embodiment depicted in FIG. 13.
Figure 14B:
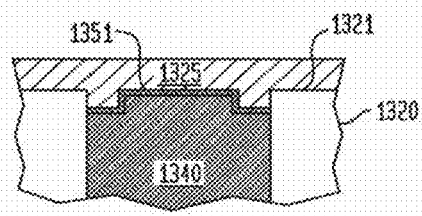
Figure 14C:
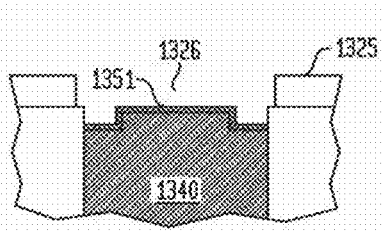

A method of fabricating the component 1310 (FIG. 13) will now be described, with reference to FIGS. 14A-14D. The method steps of FIGS. 2A-2G can be used to form the opening 1330 extending from the first surface 1321 into the substrate 1320, the conductive via 1340, the relief channels 1355, and the layer 1351 shown in FIG. 14A. Referring now to FIG. 14B, a mask layer 1325 can be deposited overlying the barrier layer 1351 and portions of the first surface 1321 of the substrate 1320. The mask layer 1325 can be patterned, and then, as shown in FIG. 14C, gaps 1326 can be formed through the mask layer to expose the barrier layer 1351 overlying one or more conductive vias 1340.

Figure 14D:
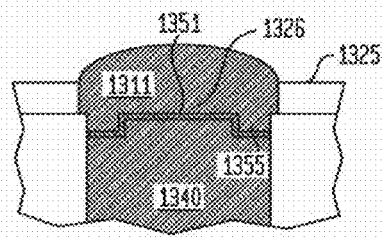

Subsequently, as shown in FIG. 14D, the conductive joining material 1311 can be deposited into the gaps 1326, such that the conductive joining material is in contact with the barrier layer 1351 and extends into the relief channels 1355. Finally, referring again to FIG. 13, the remaining portions of the mask layer 1325 can be removed from the first surface 1321 of the substrate 1320, leaving a conductive joining material 1311 that extends above the first surface of the substrate.

Figure 15:
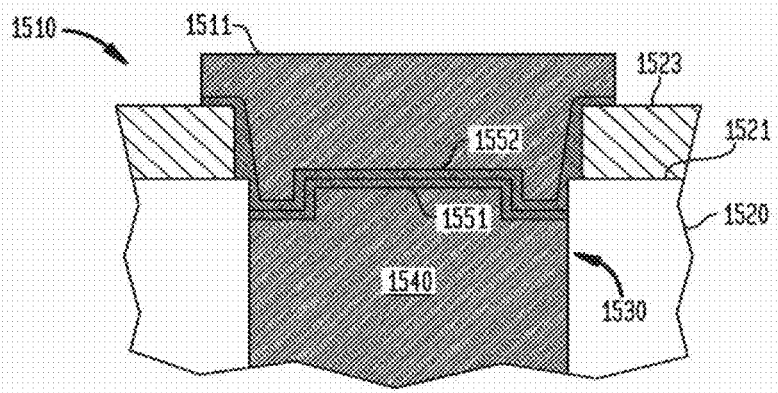
FIG. 15 is a side sectional view illustrating a component in accordance with yet another embodiment of the invention.

FIG. 15 shows a conductive via 1540 that is the same as the conductive via 1340 described above with respect to FIG. 13, except that the conductive via 1540 includes a dielectric layer 1523 overlying the first surface 1521 of the substrate 1520 outside the opening 1530 and a seed layer 1552 overlying the conductive via and a portion of the dielectric layer 1523. The dielectric layer 1523 can be a passivation layer such as the layer 23 described above with reference to FIGS. 1A and 1B. The conductive via 1540 can also have an adhesion or barrier layer 1551 (such as the layer 51 described above) that can extend between the conductive via and the seed layer 1552. In one example, the adhesion or barrier layer 1551 can be tantalum nitride/tantalum, e.g., alpha-tantalum with interstitial impurities, titanium nitride, titanium nitride/titanium, or a nickel-tungsten alloy, and the seed layer 1552 can be copper, nickel, or gold. In a particular embodiment, the adhesion or barrier layer 1551 and the seed layer 1552 can be a single layer, such as, for example, a single nickel alloy barrier and seed layer. The conductive joining material 1511 overlies the conductive via 1540 and a portion of the dielectric layer 1523. Similar to FIGS. 3A through 6C, the optional insulating dielectric layer 60 and the optional barrier layer 43 is not shown in FIGS. 15 through 16D.

A method of fabricating the component 1510 (FIG. 15) will now be described, with reference to FIGS. 16A-16D. The method steps of FIGS. 2A-2G can be used to form the dielectric layer 1523, the opening 1530 extending from the first surface 1521 into the substrate 1520, the conductive via 1540, the relief channels 1555, the adhesion or barrier layer 1551, and the seed layer 1552 shown in FIG. 16A.

Figure 16A:
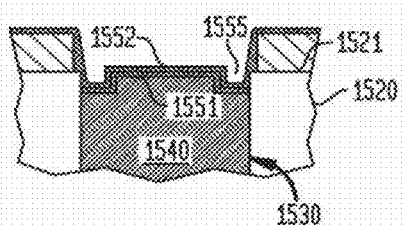
FIGS. 16A-16D are side sectional views illustrating stages of fabrication in accordance with the embodiment depicted in FIG. 15.
Figure 16B:
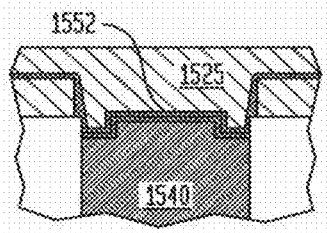
Figure 16C:
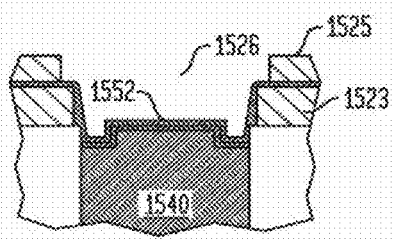
Figure 16D:
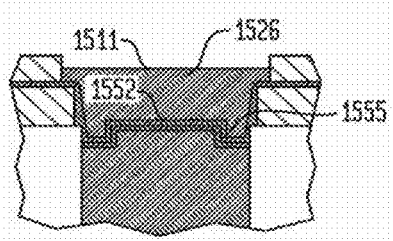

Referring now to FIG. 16B, a mask layer 1525 can be deposited overlying the seed layer 1552. The mask layer 1525 can be patterned, and then, as shown in FIG. 16C, gaps 1526 can be formed through the mask layer to expose a portion of seed layer 1552 overlying one or more conductive vias 1540 and overlying a portion of the dielectric layer 1523. Subsequently, as shown in FIG. 16D, the conductive joining material 1511 can be deposited into the gaps 1526, such that the conductive joining material is in contact with the seed layer 1552 and extends into the relief channels 1555. Finally, referring again to FIG. 15, the remaining portions of the mask layer 1525 can be removed from the dielectric layer 1523, leaving a conductive joining material 1511 that extends above the first surface of the substrate and above the dielectric layer 1523.

Figure 17A:
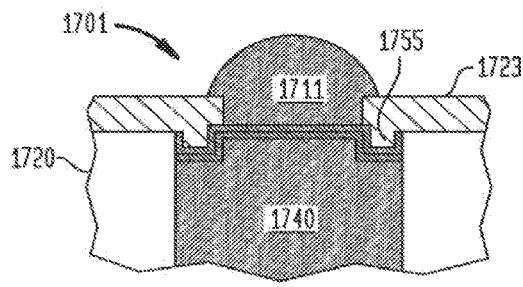
FIGS. 17A and 17B are side sectional views illustrating alternative embodiments of the component shown in FIG. 15.
Figure 17B:
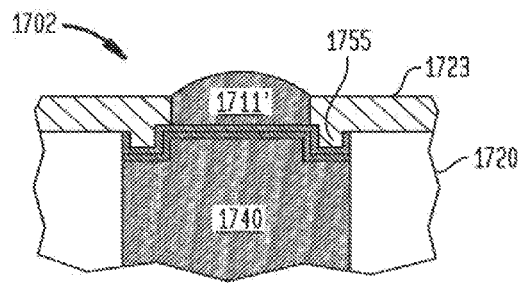

FIGS. 17A and 17B show a component 1701 and a component 1702 that are the same as the component 1510 described above with respect to FIG. 15, except that the components 1701 and 1702 include a respective conductive joining material 1711 and 1711' that does not extend into the relief channels 1755. As can be seen in FIG. 17A, the conductive joining material 1711 can overlie the conductive via 1740 and a portion of the dielectric layer 123. Alternatively, as can be seen in FIG. 17B, the conductive joining material 1711' can overlie the conductive via 1740, but the conductive joining material may not overlie a portion of the dielectric layer 1723. Similar to FIG. 15, the optional insulating dielectric layer 60 and the optional barrier layer 43 is not shown in FIGS. 17A through 18.

Figure 18:
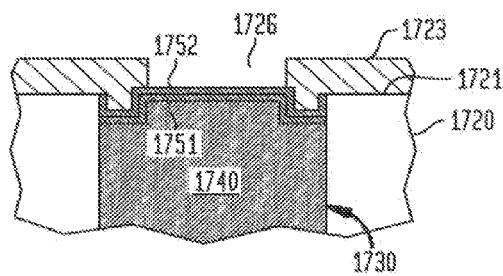
FIG. 18 is a side sectional view illustrating a stage of fabrication in accordance with the embodiments depicted in FIGS. 11A and 17B.

A method of fabricating the components 1701 (FIG. 17A) and 1702 (FIG. 17B) will now be described, with reference to FIG. 18. The method steps of FIGS. 2A-2G can be used to form the dielectric layer 1723, the opening 1730 extending from the first surface 1721 into the substrate 1720, the conductive via 1740, the relief channels 1755, the adhesion or barrier layer 1151, and the seed layer 1752 shown in FIG. 18. In FIG. 18, the adhesion or barrier layer 1751 and the seed layer 1752 are shown as being deposited onto an exposed surface of the conductive via 1740, and the dielectric layer 1723 is shown partially overlying the barrier layer and the seed layer. After the dielectric layer 1723 is deposited, the conductive joining material 1711 (FIG. 17A) or 1711' (FIG. 17B) can be deposited into the gap 1726 in the dielectric layer 1723. In a particular embodiment, a mask layer such as the mask layer 1525 shown in FIGS. 16B-16D can be deposited and patterned to control the deposition of the conductive joining material 1711 or 1711' only to desired locations.

Figure 19:
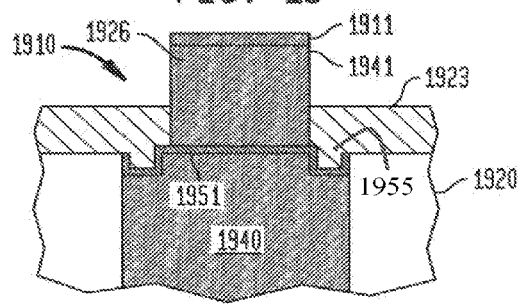
FIG. 19 is a side sectional view illustrating a component in accordance with another embodiment of the invention.

FIG. 19 shows a component 1910 that is the same as the components 1701 and 1702 described above with respect to FIGS. 17A and 17E, except that the component 1910 includes a conductive post 1941 overlying the conductive via 1940, and the conductive joining material 1911 overlies an exposed surface of the conductive post. In one example, the conductive post 1941 (and the other conductive posts described herein with respect to other embodiments) can consist essentially of at least one of: copper, a copper alloy, and nickel.

Figure 20A:
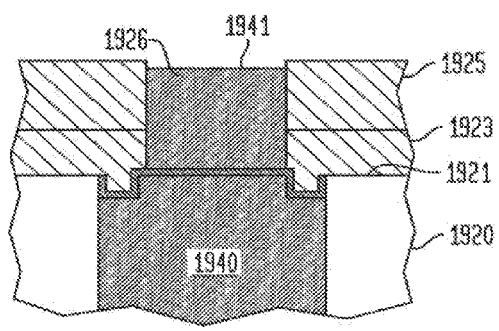
FIGS. 20A and 20B are side sectional views illustrating stages of fabrication in accordance with the embodiment depicted in FIG. 19.
Figure 20B:
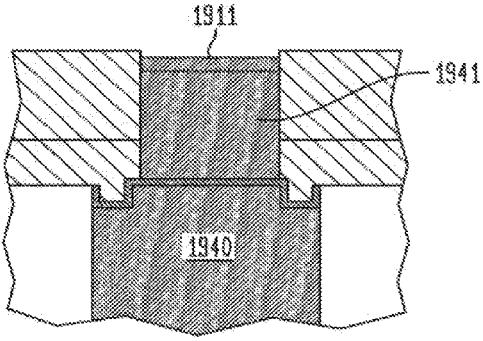

Similar to FIGS. 17A and 17B, the optional insulating dielectric layer 60 and the optional barrier layer 43 is not shown in FIGS. 19 through 20B. Also, the optional seed layer such as the seed layer 1752 shown in FIG. 18 is not shown in FIGS. 19 through 20B.

A method of fabricating the component 1910 (FIG. 19) will now be described, with reference to FIGS. 20A and 20B. The method steps of FIGS. 2A-2G can be used to form the dielectric layer 1923, the opening 1930 extending from the first surface 1921 into the substrate 1920, the conductive via 1940, the relief channels 1955, and the adhesion or barrier layer 1951. In a particular example, a seed layer such as the seed layer 1752 shown in FIG. 18 may be deposited overlying the adhesion or barrier layer 1951. The method steps of FIGS. 14B and 14C can be used to form the mask layer 1925 and the gaps 1926 in the mask layer.

Subsequently, as shown in FIG. 20A, the conductive post 1941 can be deposited into the gaps 1926, such that the conductive post is in contact with the adhesion or barrier layer 1951. Similar to the conductive via 40 described above with reference to FIGS. 1A and 1B, the conductive post 1941 can include a metal having a relatively high CTE, such as copper, aluminum, tungsten, an alloy including copper, an alloy including nickel, or an alloy including tungsten, among others. The conductive post 1941 can be made of the same electrically conductive material as the conductive via 1940, or alternatively, the conductive post and the conductive via can be made of different electrically conductive materials.

Then, referring to FIG. 20B, the conductive joining material 1911 can be deposited into the gap 1926 in the mask layer 1925 overlying the exposed surface of the conductive post 1941. Finally, referring again to FIG. 19, the remaining portions of the mask layer 1925 can be removed from the dielectric layer 1923, leaving a conductive post 1941 that extends above the first surface of the substrate and above the dielectric layer 1923, with a conductive joining material 1911 overlying an exposed surface of the conductive post.

Figure 21A:
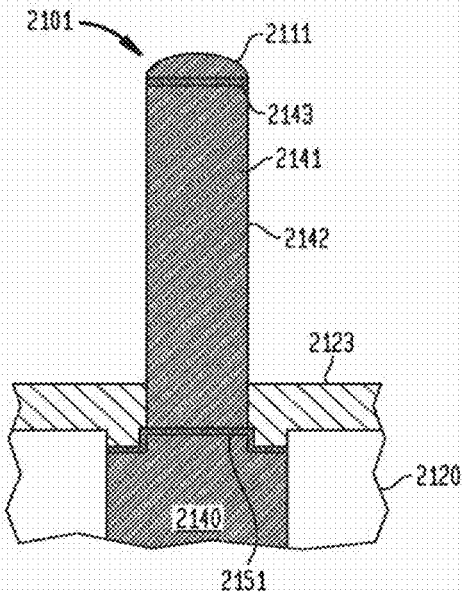
FIGS. 21A-21C are side sectional views illustrating alternative embodiments of the component shown in FIG. 19.
Figure 21B:
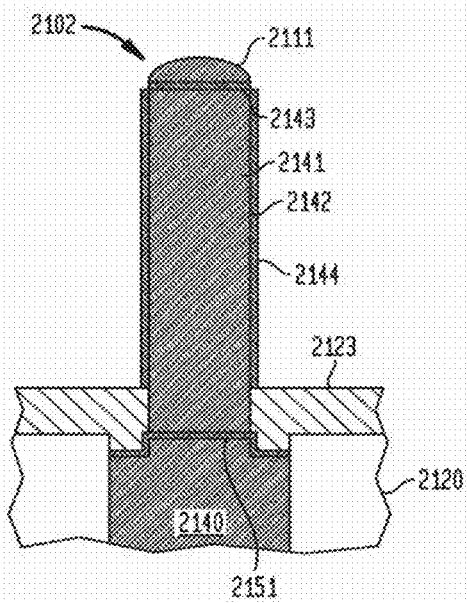
Figure 21C:
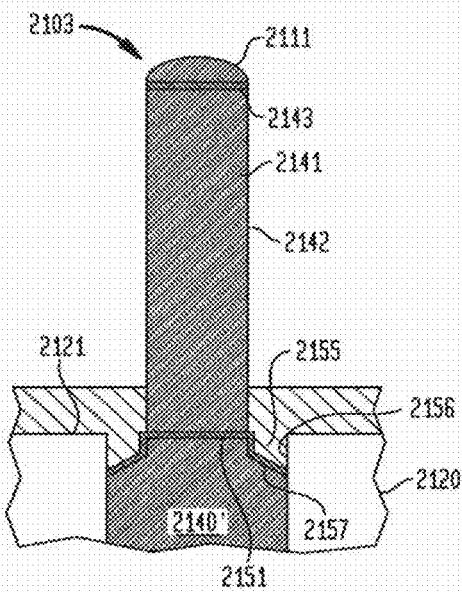

FIGS. 21A-21C show components 2101, 2102, and 2103 that are the same as the component 1910 described above with respect to FIG. 19, except that the components 2101, 2102, and 2103 include a conductive post 2141 that extends a substantial distance above an exposed surface of the dielectric layer 2123. The components 2101, 2102, and 2103 can also have a barrier layer 2143 extending between the conductive post 2141 and the conductive joining material 2111. The barrier layer 2143 can be similar to the barrier layer 1951 described above with reference to FIG. 19. Similar to FIG. 19, the optional insulating dielectric layer 60 and the optional barrier layer 43 is not shown in FIGS. 21A through 22. Also, the optional seed layer such as the seed layer 1752 shown in FIG. 18 is not shown in FIGS. 21A through 22.

As can be seen in FIG. 21A, the conductive post 2141 can have an exposed vertically-extending surface 2142. In one example, shown in FIG. 21B, the conductive post 2141 can have a barrier layer 2144 overlying the vertically-extending surface 2142. In one example, the barrier layer 2144 can be an electrically conductive barrier layer similar to the barrier layer 43 described above with reference to FIG. 1A. In another example, the barrier layer 43 can be similar to a passivation layer, which can be made from an insulating dielectric material.

In a particular embodiment, shown in FIG. 21C, the conductive via 2140' can include a relief channel 2155 having a tapered inner edge 2157 similar to that shown in FIGS. 9A and 9B, the tapered inner edge not being perpendicular to the first surface 2121 of the substrate 2120. The tapered inner edge 2157 may not be parallel to the outer edge 2156 of the relief channel 2155, and the outer edge can be perpendicular to the first surface 2121 of the substrate 2120.

Figure 22:
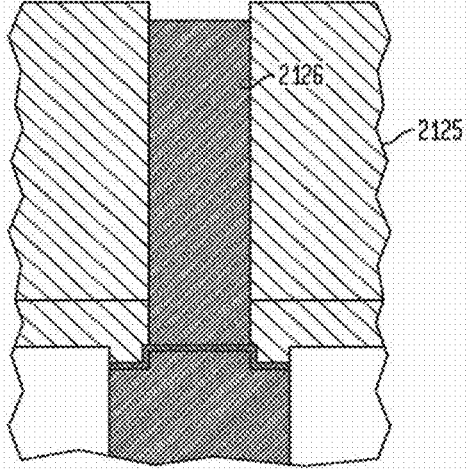
FIG. 22 is a side sectional views illustrating a stage of fabrication in accordance with any of the embodiments depicted in FIGS. 21A-21C.

FIG. 22 shows a stage in fabrication of the components 2101 and 2102 shown in FIGS. 21A and 21B. To fabricate the component 2101 shown in FIG. 21A, the same method steps described above with respect to FIGS. 19 through 20B can be performed, except the mask layer 2125 and the gaps 2126 shown in FIG. 22 can have a greater vertical height than the mask layer 1925 and the gaps 1926 shown in FIGS. 20A and 20B.

To fabricate the component 2102 shown in FIG. 21B, the same method steps for fabrication of the component 2101 can be performed, and in addition, after the mask layer 2125 is removed, the barrier layer 2144 can be deposited overlying the vertically-extending surface 2142 of the conductive post 2141.

To fabricate the component 2103 shown in FIG. 21C, the same method steps for fabrication of the component 2101 can be performed, but the relief channels 2155 of the conductive via 2140' can be formed with a tapered inner edge 2157.

Figure 23:
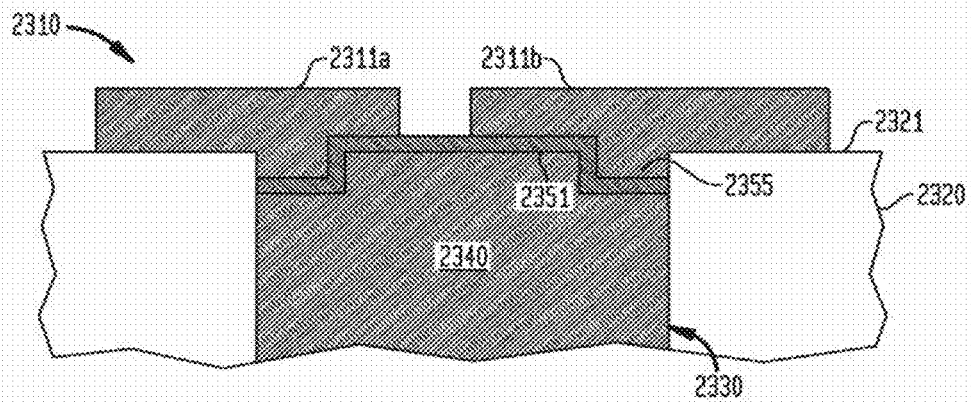
FIG. 23 is a side sectional view illustrating a component in accordance with yet another embodiment of the invention.

FIG. 23 shows a component 2310 that is the same as the component 1310 described above with respect to FIG. 13, except that the component 2310 includes two spaced-apart regions of conductive joining material 2311a and 2311b, and each region of conductive joining material can partially overlie the first surface 2321 of the substrate 2320. Each region of conductive joining material 2311a and 2311b can extend into a portion of the relief channel 2355. Similar to FIGS. 3A through 6C, the optional insulating dielectric layer 60 and the optional barrier layer 43 is not shown in FIGS. 23 through 24B.

Figure 24A:
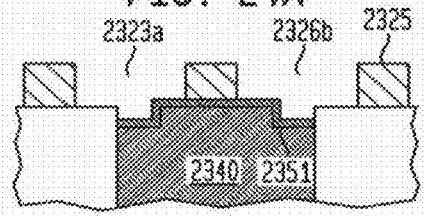
FIGS. 24A and 24B are side sectional views illustrating stages of fabrication in accordance with the embodiment depicted in FIG. 23.

A method of fabricating the component 2310 (FIG. 23) will now be described, with reference to FIGS. 24A and 24B. The method steps of FIGS. 2A-2G can be used to form the opening 2330 extending from the first surface 2321 into the substrate 2320, the conductive via 2340, the relief channels 2355, and the barrier layer 2351 shown in FIG. 23. Referring now to FIG. 24A, a mask layer 2325 can be deposited overlying the barrier layer 2351 and portions of the first surface 2321 of the substrate 2320. Gaps 2326a and 2326b can be formed through the mask layer to expose the barrier layer 2351 overlying the portions of the conductive via 2340 at which it is desired to deposit the respective regions of conductive joining material 2311a and 2311b.

Figure 24B:
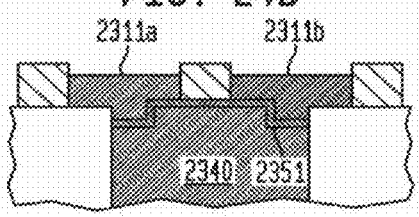

Subsequently, as shown in FIG. 24B, the conductive joining material 2311a and 2311b can be deposited into the respective gaps 2326a and 2326b, such that the regions of conductive joining material are in contact with portions of the barrier layer 2351 and extend into portions of the relief channels 2355. Finally, referring again to FIG. 23, the remaining portions of the mask layer 2325 can be removed from the first surface 2321 of the substrate 2320, leaving regions of conductive joining material 2311*a* and 2311*b* that extend above the first surface of the substrate.

Figure 25:
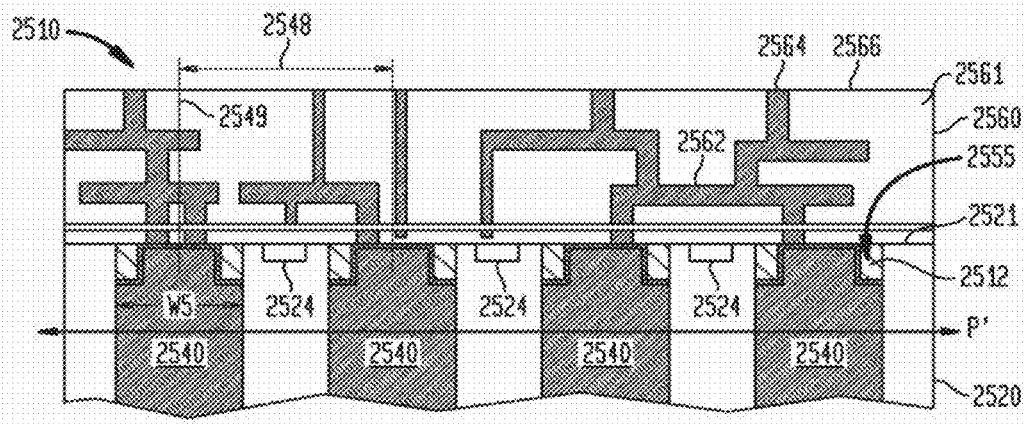
FIG. 25 is a side sectional view illustrating a component in accordance with still another embodiment of the invention.

The component 2510 shown in FIG. 25 is the same as the component 1110 described above with respect to FIG. 11A, except that the component 2510 has a plurality of conductive vias 2540 each having relief channels 2555, and a low stress material 2512 can be disposed in the relief channels at the first surface 2521 of the substrate 2520. The low stress material 2512 can be conductive (e.g., solder or a conductive adhesive paste) nonconductive (e.g., a polymer or another dielectric material), or a porous conductive or nonconductive material such as a polymer foam. Such a material can have a low modulus of elasticity, or the material can have enough collapsible pores that can compress under a load.

In embodiments where the semiconductor element 2520 includes a semiconductor substrate, made for example from silicon, one or a plurality of semiconductor devices (e.g., transistors, diodes, etc.) can be disposed in an active device region 2524 thereof located at and/or below the first surface 2521. The component 2510 can also have BEOL layers 2560 overlying the first surface of the substrate 2520 and the exposed surface of the conductive vias 2540. The BEOL layers 2560 can include an insulating dielectric material 2561 and conductive leads 2562 (conductive traces and conductive vias) extending between the conductive vias 2540 and conductive terminals 2564 exposed at a top surface 2566 of the BEOL layers 2560 for interconnection with an external component.

In one embodiment, each conductive via can have a maximum width W5 in a direction in a horizontal plane P' parallel to the first surface, the maximum width being located within five microns of the first surface. The plurality of conductive vias 2540 can define a minimum pitch 2548 in the horizontal plane P' between respective vertical central axes 2549 of any two adjacent ones of the conductive vias, the minimum pitch being less than three times the maximum width of each of the adjacent conductive vias. In a particular example, the minimum pitch 2548 between any two adjacent ones of the conductive vias 2540 can be less than two times the maximum width of each of the adjacent conductive vias. In an exemplary embodiment, the minimum pitch 2548 between any two adjacent ones of the conductive vias 2540 can be less than 1.2 times the maximum width of each of the adjacent conductive vias.

Figure 26A:
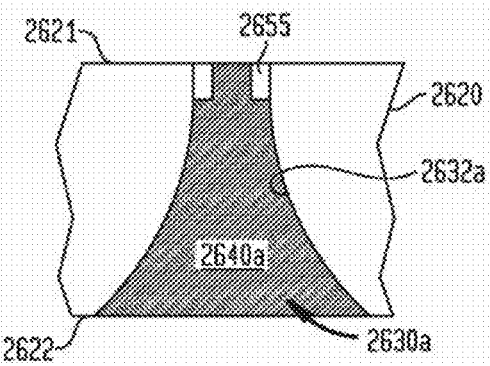
FIGS. 26A and 26B are side sectional views illustrating alternative embodiments of the conductive via shown in FIGS. 3A and 3B.
Figure 26B:
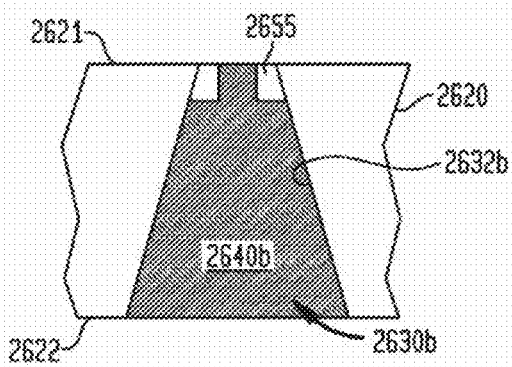

The conductive vias 2640*a* and 2640*b* shown in FIGS. 26A and 26B are the same as the conductive via 340 described above with respect to FIGS. 3A and 3B, except that the conductive vias 2640*a* and 2640*b* extend within a respective tapered opening 2630*a* and 2630*b* in a substrate 2620. Such a tapered opening 2630*a* or 2630*b* can taper in either direction between the first and second surfaces 2621, 2622 of the substrate 2620. As shown in FIG. 26A, the tapered opening 2630*a* can have an elliptic paraboloid shape, a hyperboloid shape, or a curvilinear shape (i.e., the opening is bounded by an inner wall 2632*a* having a curvilinear shape). As shown in FIG. 26B, the tapered opening 2630*b* can have a frusto-conical shape. In a particular example, a tapered opening such as the opening 2630*a* or 2630*b* can be formed by isotropic etching followed by anisotropic etching.

In one example, a portion of the opening or the entire opening 2630*a* or 2630*b* can be bounded by a surface defining a curvilinear cross-sectional shape in a plane that is perpendicular to the first surface of the substrate, and such a curvilinear opening structure can be formed by isotropic etching of the substrate from one surface (either the first or second surface) to form a cavity extending partially through the substrate, then the substrate can be thinned by removing material from the opposite surface of the substrate, and then anisotropic etching can be performed from the opposite surface to extend the cavity into an opening extending completely through the substrate.

A tapered opening 2630*a* or 2630*b* having a smaller diameter at the first surface 2621 than at the second surface 2622 can help protect structures at the first surface such as an active device region during temperature changes, because it may help prevent pumping, i.e., vertical motion of the conductive via relative to the substrate, when there is a significant difference between the coefficient of thermal expansion of the material of the conductive via and the material of the substrate.

As shown in FIGS. 26A and 26B, the openings 2630*a* and 2630*b* have relief channels 2655 extending into the exposed surface of the respective conductive via 2640*a* and 2640*b*. In a particular example, a tapered opening such as the opening 2630*a* or 2630*b* can be provided without a relief channel 2655.

The components 2701, 2702, 2703, and 2704 shown in FIGS. 27A-27D are variations of the component 2101 shown in FIG. 21A, but with a tapered opening 2730 that is the same as the tapered opening 2630*a* shown in FIG. 26A that can have an elliptic paraboloid shape, a hyperboloid shape, or a curvilinear shape. In a particular example, the tapered opening 2730 of FIGS. 27A-27D can have a frusto-conical shape like the tapered opening 2630*b* shown in FIG. 26B.

The component 2101 shown in FIG. 27A can have a conductive post 2741*a* that is the same as the conductive post 2141 shown in FIG. 21A. In one example, the conductive post 2741*a* can have conductive joining material overlying an exposed surface of the conductive post. Similar to FIG. 21A, the conductive post 2741*a* can overlie an exposed surface of the conductive via 2740, but the conductive post may not overlie the relief channels 2755. In a particular embodiment, the relief channels 2755 may be filled with a portion of a dielectric layer overlying the first surface 2721 of the substrate 2720 such as the dielectric layer 2123 shown in FIG. 21A.

The component 2102 shown in FIG. 27B is a variation of the component 2101 shown in FIG. 27A. The component 2102 can have a conductive post 2741*b* that can overlie an exposed surface of the conductive via 2740 and the relief channels 2755. In a particular embodiment, the relief channels 2755 may be filled with a low stress material 2712 disposed in the relief channels 2755 at the first surface 2721 of the substrate 2720. The low stress material 2112 can be conductive (e.g., solder or a conductive adhesive paste), nonconductive (e.g., a polymer or another dielectric material), or a porous conductive or nonconductive material such as a polymer foam. Such a material can have a low modulus of elasticity, or the material can have enough collapsible pores that can compress under a load.

Figure 27C:
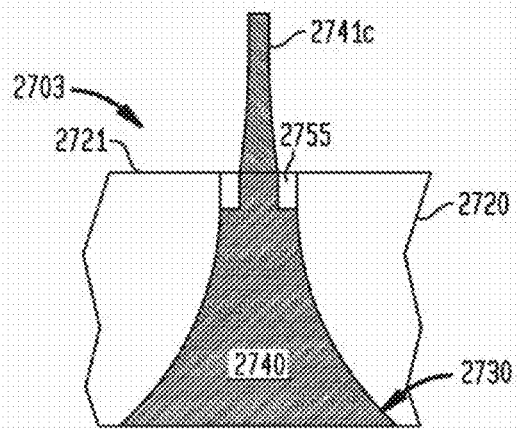
Figure 27D:
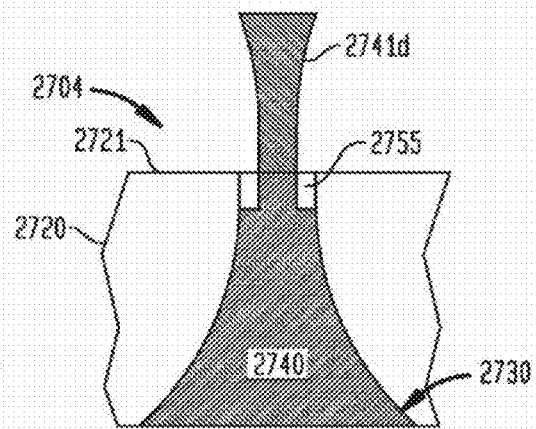

The components 2103 and 2104 shown in FIGS. 27C and 27D are further variations of the component 2101 shown in FIG. 27A. The components 2103 and 2104 can have a respective conductive post 2741*c* or 2741*d* that can overlie an exposed surface of the conductive via 2740, but the respective conductive post may not overlie the relief channels 2755. The conductive posts 2741*c* and 2741*d* shown in FIGS. 27C and 27D can have a tapered shape, for example, an elliptic paraboloid shape, a hyperboloid shape, or a curvilinear shape (i.e., the conductive post has an outer surface having a curvilinear shape in a direction generally perpendicular to the first surface of the substrate). In a particular example, the conductive posts 2741*c* and 2741*d* can have a frusto-conical shape.

As shown in FIG. 27C, the conductive post 2741*c* has a tapered shape that is wider at the base adjacent to the first surface 2721 of the substrate 2720 and narrower at the tip remote from the first surface. As shown in FIG. 27D, the conductive post 2741*d* has a tapered shape that is narrower at the base adjacent to the first surface 2721 of the substrate 2720 and wider at the tip remote from the first surface.

Figure 28A:
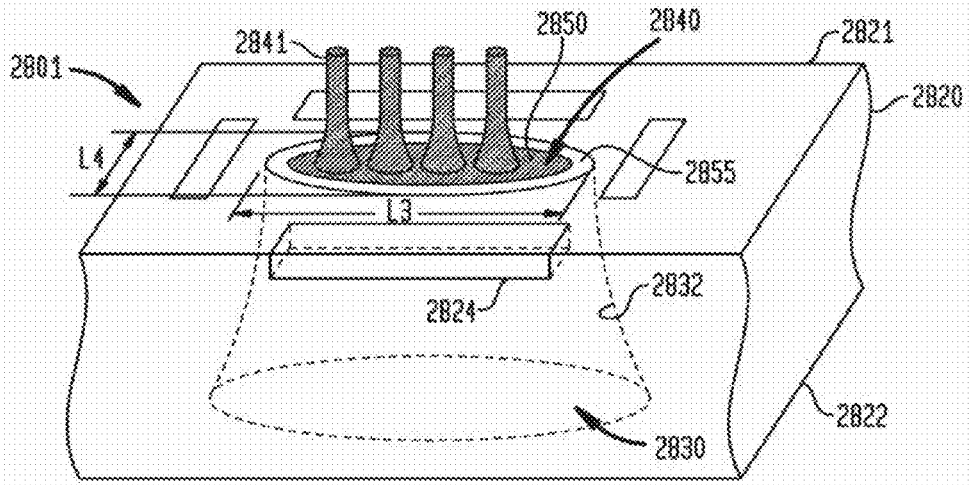
FIG. 28A is a top perspective view illustrating a component in accordance with yet another embodiment of the invention.
Figure 28B:
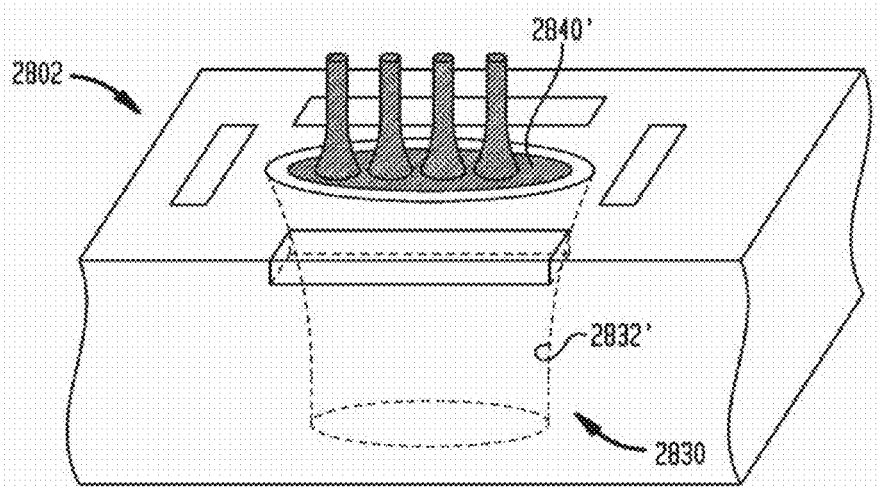
FIG. 28B is a top perspective view illustrating an alternative embodiment of the component shown in FIG. 28A.

Referring now to FIG. 28A, the component 2801 includes a conductive via 2840 that has some features of the conductive via 540*a* shown in FIG. 5A and the conductive 2740 and the conductive post 2741*c* shown in FIG. 27C. FIG. 28B shows a component 2802 that is a variation of the component 2801 having an opening 2830' with an alternative tapered shape, as described below.

Similar to the conductive via 540*a* shown in FIG. 5A, the conductive via 2840 can include a relief channel 2855, and the conductive via can have an oblong or oval shape, wherein the conductive via defines a first dimension L3 that is greater than a second dimension L4, the first and second dimensions being located in the relief plane P shown and described with respect to FIG. 1A. In a particular example, L3 can be several times greater than L4, such as, for example, 6 times or 8 times greater.

As shown in FIG. 28A, the relief channel 2855 and the opening 2830 in which the conductive via extends can each have an oblong or oval cross-sectional shape in a plane generally parallel to the first surface of the substrate. In one example, such a conductive via 2840 having an oblong or oval shape and a plurality of conductive posts 2841 extending therefrom can be used for power or ground (i.e., reference potential) distribution within the component 2801. In a particular example, the conductive via 2840 can have an elongated cross-sectional shape, the conductive via defining a length (e.g., the first dimension L3) in a first direction and a width (e.g., the second dimension L4) in a second direction transverse to the first direction, the first and second directions being within a plane that is perpendicular to the first surface 2821 of the substrate 2820, the length being greater than the width.

One or a plurality of semiconductor devices (e.g., transistors, diodes, etc.) can be disposed in one or more active device regions 2824 thereof located at and/or below the first surface 2821. The active device regions 2824 can be located between adjacent conductive vias 2840 in a single component 2801. In the example shown in FIG. 28A, one or more active device regions 2824 can be oriented substantially parallel to a direction of the first dimension L3 of the conductive via 2840, and one or more active device regions can be oriented substantially parallel to a direction of the second dimension L4 of the conductive via.

Similar to the component 2703 shown in FIG. 27C, the component 2801 can include one or more conductive vias 2840 that extend within a respective tapered opening 2830 in a substrate 2820. Such a tapered opening 2830 can taper in either direction between the first and second surfaces 2821, 2822 of the substrate 2820. In the example shown in FIG. 28A, the opening 2830 can have a cross-section in the plane of the first surface 2821 that has a smaller area than its cross-section in the plane of the second surface 2822, such that the opening tapers from the second surface toward the first surface.

In another example, as shown in FIG. 28B, the opening 2830' can have a cross-section in the plane of the first surface 2821 that has a larger area than its cross-section in the plane of the second surface 2822, such that the opening tapers from the first surface toward the second surface. Such a tapered opening 2830 or 2830' can have an elliptic paraboloid shape, a hyperboloid shape, or a curvilinear shape as described above. In a particular example, a tapered opening such as the opening 2830 or 2830' can be formed by isotropic etching followed by anisotropic etching.

Similar to the component 2703 shown in FIG. 27C, the component 2801 can include one or more conductive posts 2841 that can overlie an exposed surface 2850 of a particular conductive via 2840, but the conductive posts may not overlie the relief channel or channels 2855. The conductive post 2841 can have a tapered shape, for example, an elliptic paraboloid shape, a hyperboloid shape, or a curvilinear shape as described above. In a particular example, the conductive posts 2841 can have a frusto-conical shape.

As shown in FIG. 28A, the conductive post 2841 has a tapered shape that is wider at the base adjacent to the first surface 2821 of the substrate 2820 and narrower at the tip remote from the first surface. In a particular example, the component 2840 can include one or more conductive posts having any other shape, such as the conductive post shapes described above with respect to the various embodiments herein.

Figure 29:
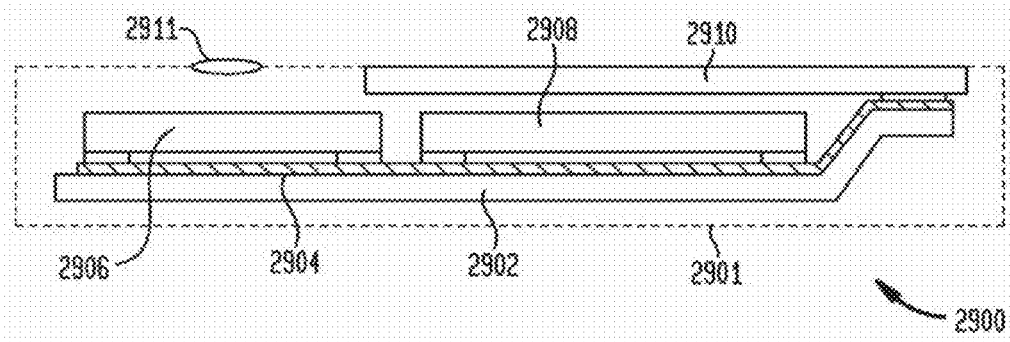
FIG. 29 is a schematic depiction of a system according to one embodiment of the invention.

The components described above can be utilized in construction of diverse electronic systems, as shown in FIG. 29. For example, a system 2800 in accordance with a further embodiment of the invention includes a microelectronic assembly 2806 as described above in conjunction with other electronic components 2808 and 2810. In the example depicted, component 2808 is a semiconductor chip whereas component 2810 is a display screen, but any other components can be used. Of course, although only two additional components are depicted in FIG. 29 for clarity of illustration, the system may include any number of such components. The microelectronic assembly 2806 may be any of the components described above. In a further variant, any number of such microelectronic assemblies 2806 can be used.

The microelectronic assembly 2806 and components 2808 and 2810 can be mounted in a common housing 2801, schematically depicted in broken lines, and can be electrically interconnected with one another as necessary to form the desired circuit. In the exemplary system shown, the system can include a circuit panel 2802 such as a flexible printed circuit board, and the circuit panel can include numerous conductors 2804, of which only one is depicted in FIG. 29, interconnecting the components with one another. However, this is merely exemplary; any suitable structure for making electrical connections can be used.

The housing 2801 is depicted as a portable housing of the type usable, for example, in a cellular telephone or personal digital assistant, and screen 2810 can be exposed at the surface of the housing. Where structure 2806 includes a light-sensitive element such as an imaging chip, a lens 2811 or other optical device also can be provided for routing light to the structure. Again, the simplified system shown in FIG. 29 is merely exemplary; other systems, including systems commonly regarded as fixed structures, such as desktop computers, routers and the like can be made using the structures discussed above.

Although a silicon substrate having active device regions therein is only shown and described with reference to the embodiment shown in FIGS. 1A and 1B, the substrate of any of the components described herein can be made of silicon or a dielectric material such as glass, ceramic, a composite material, or symmetric or asymmetric laminates, as described above. When the substrate is made of silicon, any such substrate in any of the embodiments described herein can include active semiconductor devices in one or more active device regions of the substrate.

The openings, apertures, and conductive elements disclosed herein can be formed by processes such as those disclosed in greater detail in the commonly assigned U.S. patent application Ser. Nos. 12/842,587, 12/842,612, 12/842,651, 12/842,669, 12/842,692, and 12/842,771, filed Jul. 23, 2010, and in published U.S. Patent Application Publication No. 2008/0246136, the disclosures of which are incorporated by reference herein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A structure comprising a microelectronic component comprising circuitry, the microelectronic component comprising a substrate comprising an opening in a top surface;
   wherein the circuitry comprises a conductive via in the opening;
   wherein the opening comprises a first sidewall of a first material, and the conductive via comprises a second sidewall of a second material;
   wherein at least at one side of the opening, the first and second sidewalls are spaced from each other at the top surface of the substrate but the first and second sidewalls meet below the top surface of the substrate at a meeting location, and between the meeting location and the top surface of the substrate the first and second sidewalls are separated by a third material which is a dielectric different from the first material.

2. The structure of claim 1 wherein at least at said side of the opening, the third material fills an entire space between the meeting location and the top surface of the substrate.

3. The structure of claim 1 wherein the microelectronic component further comprises a conductive barrier layer contacting the conductive via between the meeting location and the top surface of the substrate.

4. The structure of claim 1 wherein the third material provides a lower stress in case of thermal expansion than if the third material were replaced with the second material.

5. The structure of claim 1 wherein the third material comprises foam.

6. The structure of claim 1 wherein the third material comprises a polymer.

7. The structure of claim 1 wherein the first material is semiconductor.

8. The structure of claim 1 wherein the first material is dielectric.

9. The structure of claim 1 wherein the substrate is a semiconductor material.

10. The structure of claim 1 wherein the conductive via is metal.

11. The structure of claim 1 wherein the conductive via passes through the substrate.

12. The structure of claim 11 wherein the microelectronic component includes a conductive post overlying the conductive via and electrically connected to the conductive via.

13. A structure comprising a microelectronic component comprising circuitry, the microelectronic component comprising a substrate comprising an opening in a top surface;
   wherein the circuitry comprises a conductive via in the opening;
   wherein the opening comprises a first layer separating the conductive via from the substrate at least at one side of the opening, the first layer comprising at least one of a dielectric layer and a barrier layer;
   wherein the first layer comprises a first sidewall, and the substrate comprises a second sidewall in the opening;
   wherein at least at one side of the opening, the first and second sidewalls are spaced from each other at the top surface of the substrate but the first and second sidewalls meet below the top surface of the substrate at a meeting location, and between the meeting location and the top surface of the substrate the first and second sidewalls are separated by a second layer having a lower Young's modulus than the first layer.

14. The structure of claim 13 wherein the first and second layers are dielectric layers.

15. The structure of claim 13 wherein the first layer comprises a third sidewall, and the conductive via comprises a fourth sidewall;
   wherein at least at said side of the opening, the third and fourth sidewalls are separated from each other at the top surface of the substrate but the third and fourth sidewalls meet below the top surface of the substrate.

* * * * *